US010593792B2

(12) United States Patent
Watanabe

(10) Patent No.: US 10,593,792 B2
(45) Date of Patent: Mar. 17, 2020

(54) SEMICONDUCTOR DEVICE AND METHOD FOR MANUFACTURING THE SAME

(71) Applicant: HITACHI, LTD., Chiyoda-ku, Tokyo (JP)

(72) Inventor: Naoki Watanabe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/046,642

(22) Filed: Jul. 26, 2018

(65) Prior Publication Data
US 2019/0081171 A1 Mar. 14, 2019

(30) Foreign Application Priority Data

Sep. 13, 2017 (JP) ................ 2017-175603

(51) Int. Cl.
H01L 29/00 (2006.01)
H01L 29/78 (2006.01)
(Continued)

(52) U.S. Cl.
CPC .... *H01L 29/7811* (2013.01); *H01L 21/02164* (2013.01); *H01L 21/02271* (2013.01); *H01L 21/02378* (2013.01); *H01L 21/02527* (2013.01); *H01L 21/02529* (2013.01); *H01L 21/042* (2013.01); *H01L 21/044* (2013.01); *H01L 21/049* (2013.01); *H01L 21/0415* (2013.01); *H01L 21/0465* (2013.01); *H01L 21/0475* (2013.01); *H01L 29/0607* (2013.01); *H01L 29/0619* (2013.01); *H01L 29/0623* (2013.01); *H01L 29/0696* (2013.01); *H01L 29/086* (2013.01); *H01L 29/0821* (2013.01); *H01L 29/0865* (2013.01); *H01L 29/0878* (2013.01); *H01L 29/0882* (2013.01); *H01L 29/1095* (2013.01); *H01L 29/36* (2013.01);
*H01L 29/417* (2013.01); *H01L 29/41708* (2013.01); *H01L 29/41741* (2013.01); *H01L 29/4236* (2013.01); *H01L 29/42376* (2013.01); *H01L 29/4916* (2013.01); *H01L 29/66348* (2013.01); *H01L 29/66734* (2013.01); *H01L 29/7397* (2013.01);
(Continued)

(58) Field of Classification Search
None
See application file for complete search history.

(56) References Cited

U.S. PATENT DOCUMENTS 6,342,709 B1 * 1/2002 Sugawara ........... H01L 29/0619
257/139
2012/0319136 A1 12/2012 Noborio et al.
2017/0012108 A1 * 1/2017 Sakakibara ......... H01L 21/2033

FOREIGN PATENT DOCUMENTS

JP 2012-169386 A 9/2012
JP 2015-128184 A 7/2015

* cited by examiner

*Primary Examiner* — Reema Patel
(74) *Attorney, Agent, or Firm* — Miles & Stockbridge, P.C.

(57) ABSTRACT

A semiconductor device includes a semiconductor substrate having a main surface and a back surface, a drift region having a first conductivity type, a body region formed in the drift region and having a second conductivity type, a plurality of grooves passing through the body region from the main surface toward the back surface, a gate electrode formed in the plurality of grooves with a gate insulating film interposed therebetween, and an electric field relaxation layer provided below the plurality of grooves in the drift region and having a second conductivity type. The electric field relaxation layer continuously extends over the entire body region.

9 Claims, 24 Drawing Sheets

(51) Int. Cl.
*H01L 29/08* (2006.01)
*H01L 21/04* (2006.01)
*H01L 29/49* (2006.01)
*H01L 21/02* (2006.01)
*H01L 29/66* (2006.01)
*H01L 29/417* (2006.01)
*H01L 29/739* (2006.01)
*H01L 29/10* (2006.01)
*H01L 29/423* (2006.01)
*H01L 29/36* (2006.01)
*H01L 29/06* (2006.01)
*H01L 29/16* (2006.01)

(52) U.S. Cl.
CPC .... *H01L 29/7813* (2013.01); *H01L 21/02634* (2013.01); *H01L 29/1602* (2013.01); *H01L 29/1608* (2013.01)

|  | DRAIN (D) | SOURCE (S) | GATE (G) |
|---|---|---|---|
| ON | 2(V) | 0(V) | 15(V) |
| OFF | 600(V) | 0(V) | 0(V) |

SEMICONDUCTOR DEVICE AND METHOD FOR MANUFACTURING THE SAME

CROSS-REFERENCE TO RELATED APPLICATION

This application claims the priority of Japanese Patent Application No. 2017-175603 filed Sep. 13, 2017, which is incorporated herein by reference in its entirety.

BACKGROUND OF THE INVENTION

1. Field of the Invention

The present invention relates to a semiconductor device and a method for manufacturing the same, and more particularly to a semiconductor device including a transistor having a trench gate structure, and a method for manufacturing the same.

2. Description of the Related Art

Low loss power semiconductor devices using wide gap semiconductor materials such as silicon carbide (SiC), gallium nitride (GaN), and diamond have been studied for energy saving of power electronics products.

Application examples of the wide gap semiconductor materials include a Schottky barrier diode (SBD) and a power metal oxide semiconductor field effect transistor (MOSFET) which are unipolar devices, and a PN diode and an insulated gate bipolar transistor (IGBT) which are bipolar devices. In particular, a bipolar device using silicon carbide (SiC) can be expected as a device realizing low conduction loss in an ultrahigh voltage application exceeding 6.5 kV.

Silicon carbide (SiC) or gallium nitride (GaN) has an insulation breakdown electric field strength about ten times higher than that of silicon (Si), so that the film thickness of a drift region can be set to ¹⁄₁₀ of that of silicon (Si) in the case of a power semiconductor device having the same withstand voltage. Thus, the resistance of the drift region is largely reduced by decreasing the thickness of the drift region, so that the ON resistance of the entire device can be reduced.

It is effective to increase a channel density as means for reducing the ON resistance of a power switching element such as a power MOSFET or an IGBT. In a silicon element, a trench gate structure is utilized and put to practical use. However, when an MOSFET having a trench gate structure is formed on a wide gap semiconductor substrate, an electric field having a strength ten times as high as that of a silicon (Si) device is applied to a gate insulating film formed in a trench, which causes a problem that the gate insulating film is easily broken, particularly in a trench corner part.

For example, techniques for preventing the breaking of a gate insulating film are disclosed in JP 2012-169386 A and JP 2015-128184 A.

SUMMARY OF THE INVENTION

In JP 2012-169386 A, a plurality of p-type deep layers 10 are provided in a stripe form so as to intersect a gate electrode 9 having a trench structure, to prevent the breaking of the gate insulating film.

However, in the structure disclosed in JP 2012-169386 A, only a part of a trench 6 is covered with the p-type deep layers 10 (electric field relaxation layer), so that an electric field relaxation effect in a region not covered with the p-type deep layers 10 cannot be expected. That is, it is desired to further improve the reliability of a semiconductor device. The p-type deep layers 10 are formed in a stripe form, which causes an increase in the number of manufacturing steps.

In JP 2015-128184 A, a p-type electric field relaxation region 20 is selectively formed on the bottom part and side surface part of a trench 18 along the extending direction of the trench 18, to prevent the insulation breakdown of a gate insulating film.

However, the step of forming the electric field relaxation region 20 requires a step of selectively forming a filling material 32 in the trench 18 and a step of subjecting impurities to diagonal ion implantation, which causes an increase in the number of manufacturing steps.

Therefore, the present invention improves the reliability of the semiconductor device.

In another aspect of the present invention, the manufacturing step of the semiconductor device is simplified.

A semiconductor device according to one Example includes a semiconductor substrate having a main surface and a back surface, a drift region provided in the semiconductor substrate so as to be in contact with the main surface, the drift region having a first conductivity type, a body region selectively provided in the drift region, the body region having a second conductivity type different from the first conductivity type, and first and second grooves passing through the body region, the first and second grooves extending in a first direction in plan view and disposed in a spaced relationship from each other in a second direction perpendicular to the first direction. The semiconductor device further includes: a first semiconductor region formed in the body region, the first semiconductor region disposed between the first groove and the second groove and having the second conductivity type; a second semiconductor region formed in the body region, the second semiconductor region disposed between the first groove and the first semiconductor region and having the first conductivity type; and a third semiconductor region formed in the body region, the third semiconductor region disposed between the second groove and the first semiconductor region and having the first conductivity type. The semiconductor device further includes a fourth semiconductor region formed in the drift region, the fourth semiconductor region disposed below the first and second grooves and having the second conductivity type, a first gate electrode formed in the first groove with a first gate insulating film interposed therebetween, a second gate electrode formed in the second groove with a second gate insulating film interposed therebetween, a first electrode formed on the main surface of the semiconductor substrate, the first electrode electrically connected to the first semiconductor region, the second semiconductor region, and the third semiconductor region, and a second electrode formed on the back surface of the semiconductor substrate. The fourth semiconductor region continuously extends below the first groove and below the second groove in the first direction; and the fourth semiconductor region continuously extends below the first groove, the second semiconductor region, the first semiconductor region, the third semiconductor region, and the second groove in the second direction.

A method for manufacturing a semiconductor device according to one Example includes (a) preparing a semiconductor substrate having a main surface and a back surface, having an active region and a termination region surrounding the active region on the main surface in plan view, and having a drift region having a first conductivity type so as to be in contact with the main surface in cross section view, (b) forming a body region having a second conductivity type different from the first conductivity type and a first semiconductor region located below the body region and having the second conductivity type in the semiconductor substrate exposed from a first mask layer having a first opening corresponding to the active region and formed on the main surface, using the first mask layer, (c) forming a plurality of second semiconductor regions having the second conductivity type in the body region using a second mask layer formed on the main surface and having a plurality of second openings, (d) forming a third semiconductor region having the first conductivity type between the plurality of second semiconductor regions in the body region, (e) forming a groove extending from the main surface toward the back surface, and passing through the third semiconductor region and the body region without passing through the first semiconductor region, and (f) forming a gate electrode in the groove with a gate insulating film interposed therebetween.

According to one aspect of the present invention, the reliability of the semiconductor device can be improved.

According to another aspect of the present invention, the manufacturing step of the semiconductor device can be simplified.

Other problems, configurations, and advantages than described above will become apparent from the following description of embodiments.

DESCRIPTION OF THE PREFERRED EMBODIMENTS

A semiconductor device (semiconductor chip) 100 of the present Example relates to, for example, a power MOSFET or an insulated gate bipolar transistor formed on a semiconductor substrate SB. The semiconductor substrate SB is made of a semiconductor material having a wider band gap than that of silicon (Si), for example, a wide gap semiconductor such as silicon carbide (SiC), gallium nitride (GaN), or diamond. In the following Examples, description will be made using silicon carbide (SiC).

Examples of the present invention will be described below with reference to the drawings.

Example 1

<Structure of Semiconductor Device>

The semiconductor device 100 according to Example 1 is a trench gate type power MOSFET, and a trench gate type power MOSFET (sometimes simply referred to as a "transistor") is formed on the semiconductor substrate SB. In Example 1, an n-channel trench gate type power MOSFET will be described as an example, but a p-channel type trench gate type power MOSFET can also be used.

Figure 1:
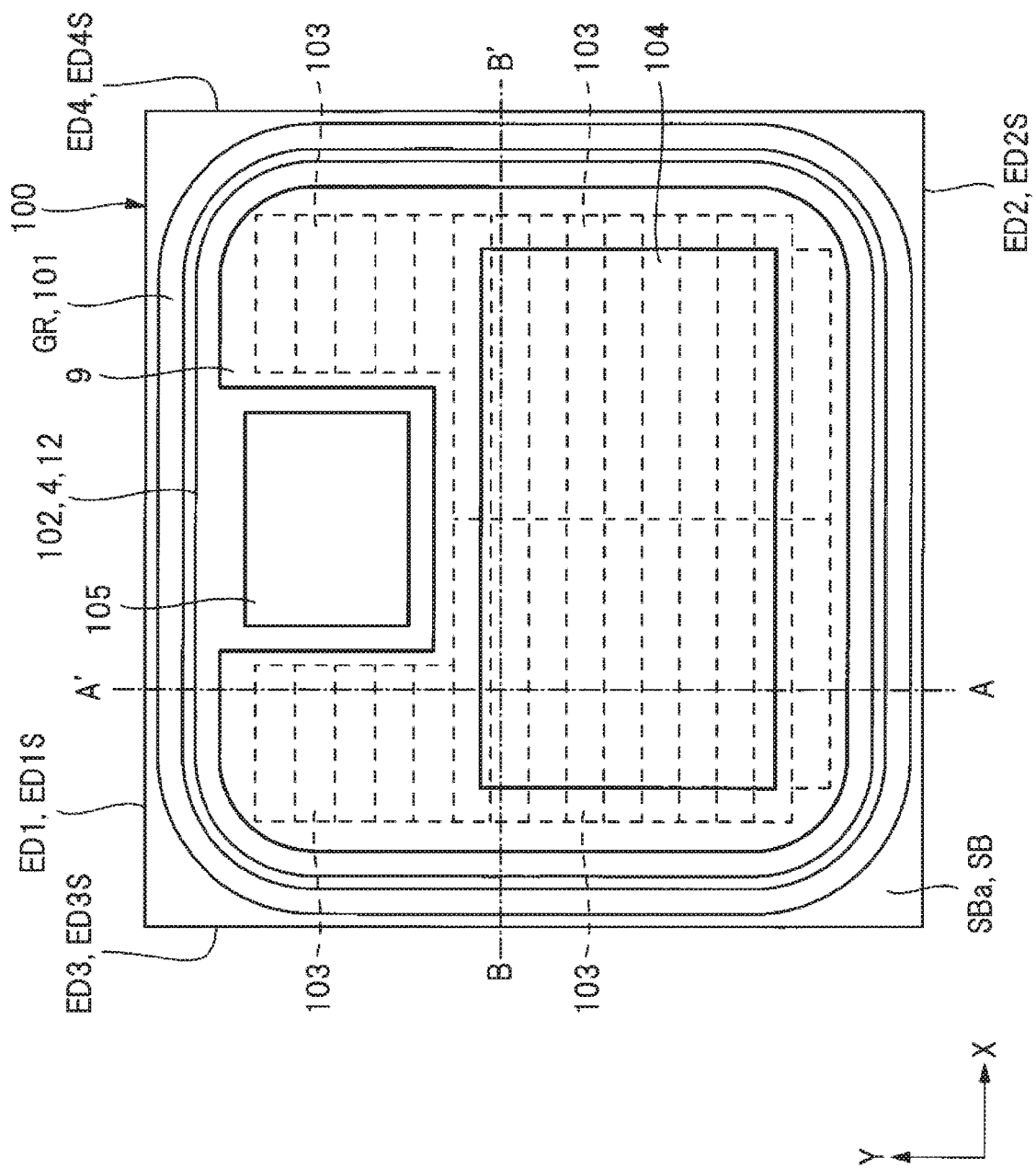
FIG. 1 is a plan view of a semiconductor device according to Example 1.
Figure 2:
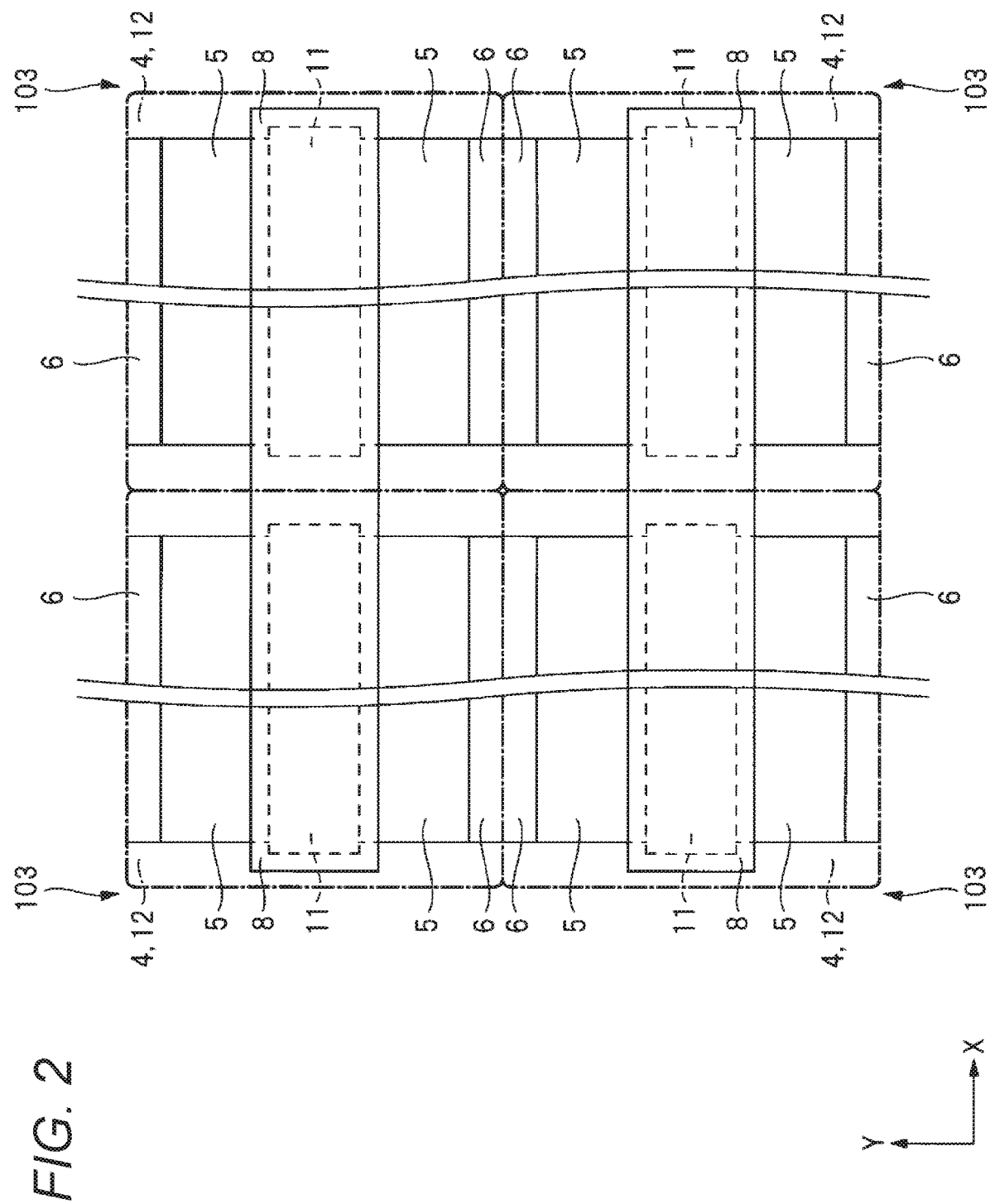
FIG. 2 is an enlarged plan view of a main part in FIG. 1.
Figure 3:
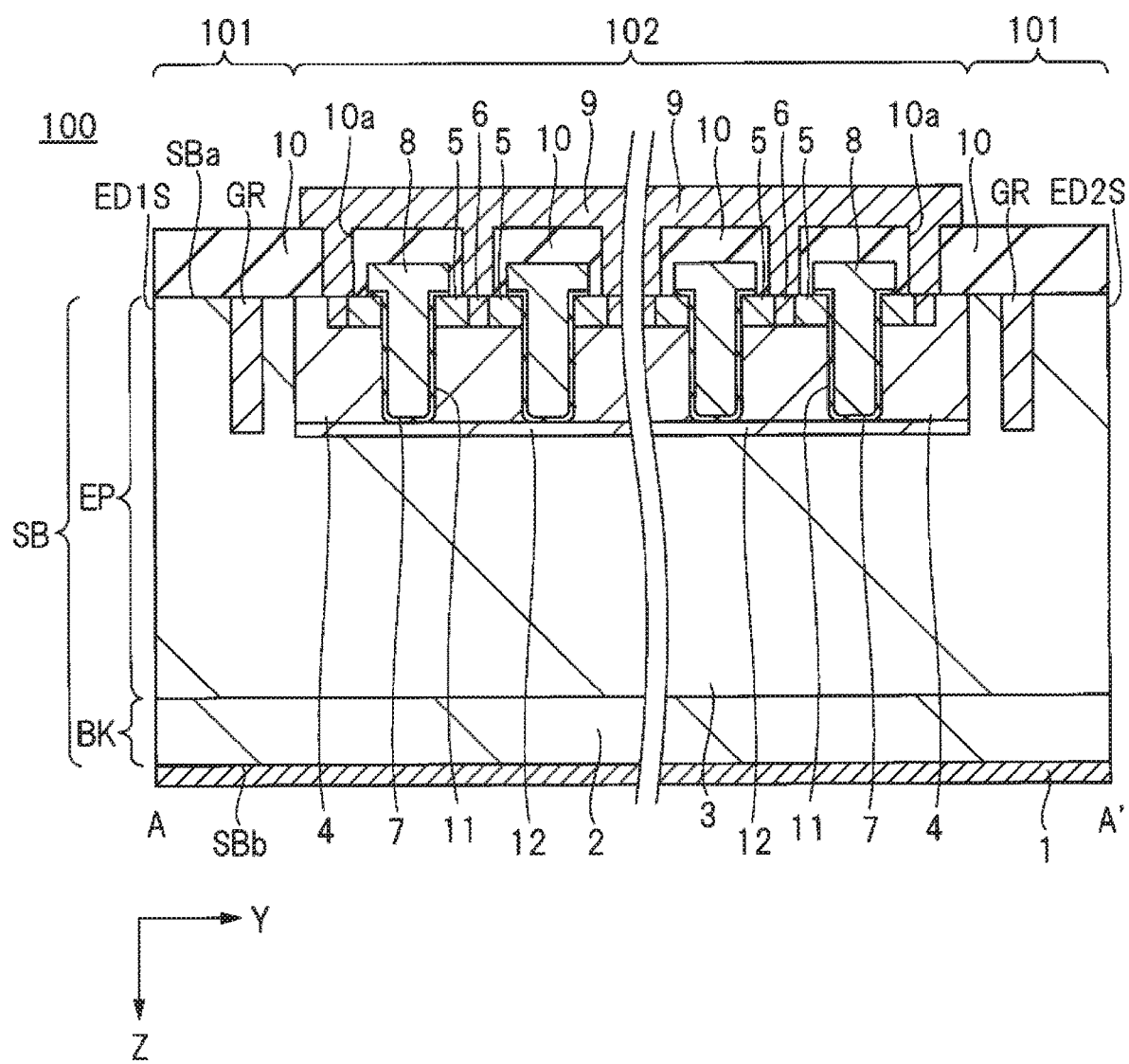
FIG. 3 is a cross-sectional view taken along a line AA' in FIG. 1.
Figure 4:
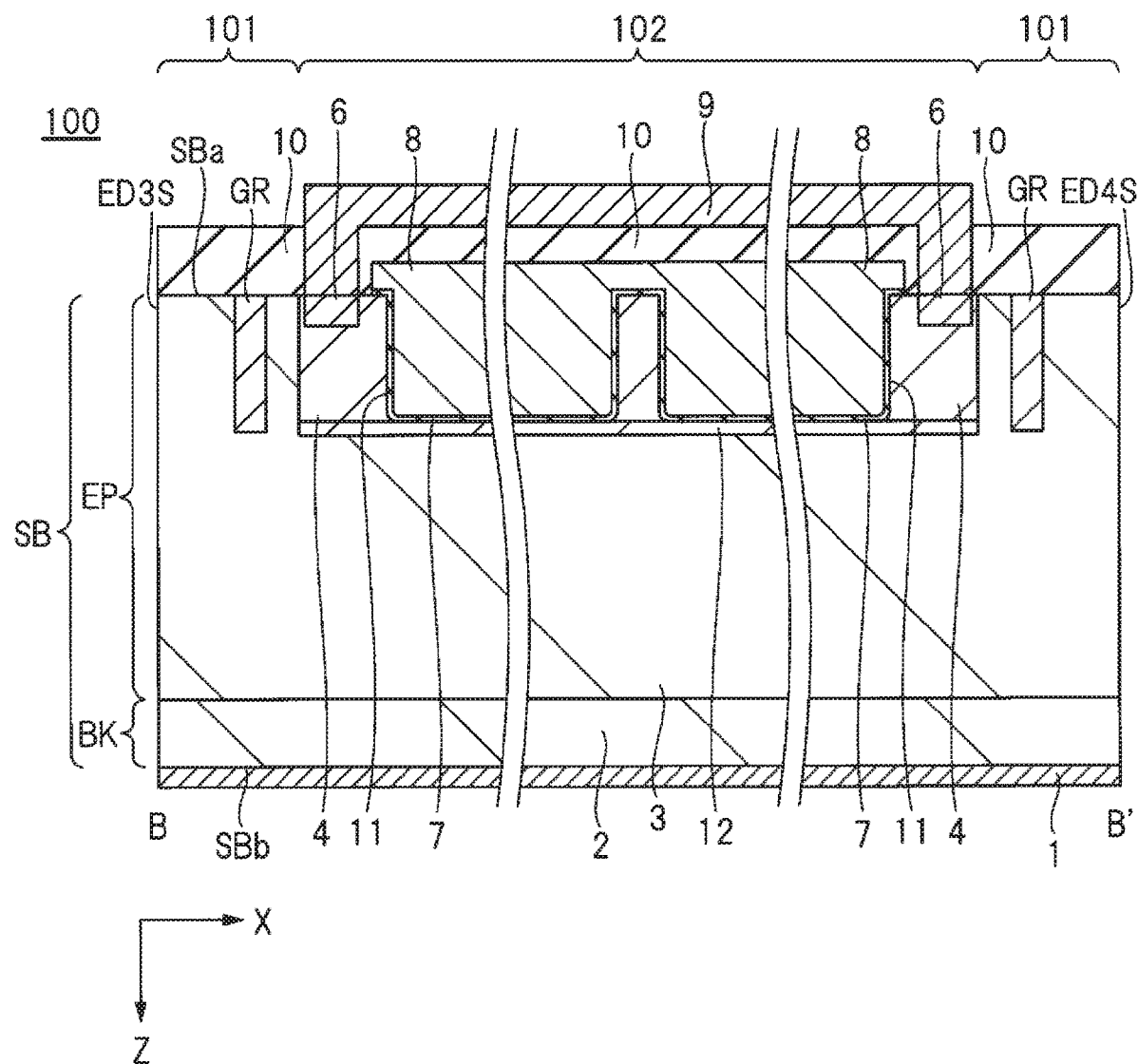
FIG. 4 is a cross-sectional view taken along a line BB' of FIG. 1.

FIG. 1 is a plan view of a semiconductor device (semiconductor chip) 100 according to Example 1. FIG. 1 is a plan view of the semiconductor substrate SB as viewed from a main surface SBa side. In FIG. 1, the lateral direction of a paper surface is defined as an X direction, and the longitudinal direction thereof is defined as a Y direction (perpendicular to the X direction). FIG. 2 is an enlarged plan view of a main part in FIG. 1. FIG. 3 is a cross-sectional view taken along a line AA' in FIG. 1. FIG. 4 is a cross-sectional view taken along a line BB' of FIG. 1.

As shown in FIG. 1, the semiconductor device 100 has a rectangular parallelepiped shape or a cubic shape. In other words, the semiconductor device 100 is formed on the rectangular parallelepiped or cubic semiconductor substrate SB. The semiconductor device 100 (or the semiconductor substrate SB) has a main surface SBa, a back surface SBb, and four side walls (side surfaces) ED1S, ED2S, ED3S, and ED4S. The main surface SBa and the back surface SBb each have four sides ED1, ED2, ED3, and ED4. For example, the side wall ED1S connects the side ED1 of the main surface SBa and the side ED1 of the back surface SBb. The other side walls ED2S, ED3S, and ED4S are also the same.

A substantially quadrangular active region (active region) 102 is disposed on the central part of the main surface SBa of the semiconductor substrate SB, and a termination region 101 is disposed around the active region 102. A body region (p-type semiconductor region) 4 and an electric field relaxation layer (p-type semiconductor region) 12, which will be described later, are formed in the entire active region 102. That is, the body region 4 and the electric field relaxation layer 12 have a planar shape equal to that of the active region 102. The termination region 101 is disposed between the active region 102 and the sides ED1, ED2, ED3 and ED4.

In the active region 102, a power MOSFET composed of a plurality of unit active cells 103 is formed. The unit active cell 103 has a rectangular shape, and has a length in an X direction more than a width in a Y direction. That is, the unit active cell 103 extends in the X direction. In the X direction, for example, the two unit active cells 103 are disposed. In the Y direction, the plurality of unit active cells 103 are stacked in a multistage manner.

In the active region 102, a source electrode 9 is disposed so as to cover the plurality of unit active cells 103. A source pad 104 is disposed in a part of the source electrode 9. In the active region 102, a gate pad 105 is disposed in a region where the source electrode 9 is not disposed. The source pad 104 and the gate pad 105 are regions to which terminals for connecting the semiconductor device 100 and the outside are connected. The source pad 104 is electrically connected to the source electrode 9, and the gate pad 105 is electrically connected to a gate electrode 8 which will be described later.

In the termination region 101, for example, a ring shaped guard ring (p-type semiconductor region) GR is formed. The guard ring GR continuously surrounds the active region 102.

FIG. 2 is an enlarged plan view of a main part of FIG. 1, and shows four unit active cells adjacent in the X direction and the Y direction. The unit active cell 103 includes a groove 11, a gate electrode 8, two source regions (n-type semiconductor regions) 5 located at both ends of the gate electrode 8 in the Y direction, and two body connecting regions (p-type semiconductor regions) 6 disposed on the opposite side of the gate electrode 8 with respect to the source regions 5 in the Y direction. In FIG. 2, the source electrode 9, an interlayer insulating film 10, and an opening 10a are omitted. The groove 11, the gate electrode 8, the source region 5, and the body connecting region 6 extend in the X direction.

As shown in FIG. 2, in the X direction and the Y direction, the gate electrode 8 is larger than the groove 11, and covers the entire groove 11. In the two unit active cells 103 adjacent in the X direction, the two grooves 11 are independently formed. That is, in the two unit active cells 103 adjacent in the X direction, the grooves 11 are separated. However, in the two unit active cells 103 adjacent in the X direction, the gate electrode 8 is continuously formed, and covers the two grooves 11.

The body region 4 and the electric field relaxation layer 12 are formed over the entire unit active cell 103. The body region 4 and the electric field relaxation layer 12 are continuously formed with respect to the four unit active cells 103 adjacent to each other in the X direction and the Y direction.

FIG. 3 is a cross-sectional view taken along a line AA' of FIG. 1, and FIG. 4 is a cross-sectional view taken along a line BB' of FIG. 1. As shown in FIGS. 3 and 4, the semiconductor substrate SB has the main surface SBa and the back surface SBb. The source electrode 9 is formed on the main surface SBa side, and a drain electrode 1 is formed on the back surface SBb side. The semiconductor substrate SB has a laminated structure of a bulk substrate BK and an epitaxial layer EP on the bulk substrate BK. In the bulk substrate BK, an n-type drain region (n-type semiconductor region) 2 containing nitrogen, phosphorus, and the like is formed, and an n-type drift region (n-type semiconductor region) 3 containing nitrogen, phosphorus, and the like is formed in the epitaxial layer EP. The drain electrode 1 is connected to the drain region 2. The impurity concentration of the drain region 2 is, for example, $1 \times 10^{18}$ cm$^{-3}$ or more, and the impurity concentration of the drift region 3 is, for example, less than $5 \times 10^{15}$ cm$^{-3}$. That is, the impurity concentration of the drain region 2 is higher than the impurity concentration of the drift region 3.

A p-type body region (p-type semiconductor region) 4 containing aluminum, boron, and the like is formed so as to be in contact with the main surface SBa of the semiconductor substrate SB in the drift region 3. The impurity concentration of the body region 4 is, for example, $1 \times 10^{17}$ cm$^{-3}$. The body region 4 is continuously formed in the entire active region 102, and is not formed in the termination region 101.

An n-type source region (n-type semiconductor region) 5 containing nitrogen, phosphorus, and the like is formed so as to be in contact with the main surface SBa of the semiconductor substrate SB in the body region 4. The impurity concentration of the source region 5 is, for example, $1 \times 10^{19}$ cm$^{-3}$ or more, and higher than the impurity concentration of each of the drift region 3 and the drain region 2.

A p-type body connecting region (p-type semiconductor region) 6 containing aluminum, boron, and the like is formed so as to be in contact with the main surface SBa of the semiconductor substrate SB in the body region 4. The body connecting region 6 is sandwiched between the two source regions 5 in the Y direction. The body connecting region 6 is connected to the body region 4. The impurity concentration of the body connecting region 6 is, for example, $1 \times 10^{19}$ cm$^{-3}$ or more and higher than the impurity concentration of the body region 4.

The groove 11 extends from the main surface SBa of the semiconductor substrate SB toward the back surface SBb, and passes through the source region 5 and the body region 4. On the inner wall of the groove 11, for example, a gate insulating film 7 composed of an insulating film such as a silicon oxide film is formed. On the gate insulating film 7, for example, a gate electrode 8 composed of a conductive film such as a polysilicon film is formed. As shown in FIG. 3, in cross-sectional view, the gate electrode 8 has a nail head shape. That is, the gate electrode 8 is embedded in the groove 11, and further runs on the main surface SBa of the semiconductor substrate SB. However, the gate electrode 8 does not necessarily have a nail head shape, and may be formed only in the groove 11. The plurality of grooves 11 and gate electrodes 8 are disposed at predetermined intervals in the Y direction of FIG. 3, and extend in a direction (not shown, but in the X direction) perpendicular to the paper surface of FIG. 3. The depth of the groove 11 is, for example, 1 μm. As described in FIG. 2, in the Y direction, the source region 5, the body connecting region 6, and the source region 5 are sequentially disposed between the two adjacent grooves 11 (in other words, the gate electrodes 8). As apparent from FIGS. 1, 2, 3, and 4, the grooves 11 are formed in the body region 4 in the X direction and the Y direction, and are not formed outside the body region 4. However, in the depth direction (Z direction in FIGS. 3 and 4), the groove 11 passes through the body region 4.

The interlayer insulating film (insulating film) 10 composed of an insulating film such as a silicon oxide film is formed on the main surface SBa of the semiconductor substrate SB so as to cover the gate electrode 8. The interlayer insulating film 10 has a plurality of openings 10a, and a part of the source region 5 and the body connecting region 6 are exposed in the openings 10a.

In the active region 102, the source electrode 9 made of a metal conductor film such as an aluminum film, a titanium film, a nickel film, or a gold film is formed on the interlayer insulating film 10 and in the opening 10a. The source electrode 9 is connected to the source region 5 and the body connecting region 6.

The semiconductor device 100 includes the p-type electric field relaxation layer (p-type semiconductor region) 12 containing aluminum, boron, and the like. The electric field relaxation layer 12 is provided below the groove 11, and the groove 11 does not pass through the electric field relaxation layer 12. It is important that the electric field relaxation layer 12 is present below the groove 11. In the depth direction (the Z direction from the main surface SBa toward the back surface SBb), the groove 11 may partially get through the electric field relaxation layer 12. The electric field relaxation layer 12 is formed below the body region 4 so as to be in contact with the body region 4. Furthermore, the electric field relaxation layer 12 is formed continuously over the entire body region 4 in plan view. In other words, the electric field relaxation layer 12 is continuously formed in a plate shape below the groove 11, the source region 5 and the body connecting region 6 in the X direction and the Y direction. Note that "A is formed below B" means that A is located on the back surface SBb side of the semiconductor substrate SB with respect to B in the depth direction (Z direction).

Here, the impurity concentration of the electric field relaxation layer 12 is, for example, $2\times10^{16}$ cm$^{-3}$ to $1\times10^{17}$ cm$^{-3}$. It is important that the impurity concentration of the electric field relaxation layer 12 is higher than the impurity concentration of the drift region 3. It is preferable that the impurity concentration of the electric field relaxation layer 12 is equal to or slightly lower than the impurity concentration of the body region 4. This is because the entire electric field relaxation layer 12 is depleted in the depth direction (Z direction) during the ON operation of the power MOSFET (ON). For the same reason, it is preferable that the thickness of the electric field relaxation layer 12 is set to about 100 nm below the groove 11.

As shown in FIGS. 3 and 4, a p-type guard ring (p-type semiconductor region) GR containing aluminum, boron, and the like is formed in the termination region 101. The guard ring GR is separated from the body region 4 and the electric field relaxation layer 12. As described in FIG. 1, the guard ring GR has a ring shape, and continuously surrounds the body region 4. In FIG. 3, the single guard ring GR is shown, but a multiple guard ring GR may be used. The impurity concentration of the guard ring GR may be equal to the impurity concentration of the body region 4, for example, and may be formed simultaneously with the step of forming the body region 4.

As shown in FIG. 4, in the X direction, the gate electrode 8 is continuously formed in the inner regions of the two grooves 11 and in the region between the two grooves 11.

As shown in FIGS. 3 and 4, in the X direction and the Y direction, the electric field relaxation layer 12 is terminated between the groove 11 and the side walls ED1S, ED2S, ED3S and ED4S, in other words, between the groove 11 and the termination region 101 (or the guard ring GR).

<Description of Operation of MOSFET>

Figures 5, 6:
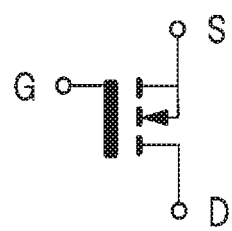
FIG. 5 is an equivalent circuit diagram of the semiconductor device according to Example 1.
FIG. 6 is a table showing an operating voltage of the semiconductor device of Example 1.
Figure 7:
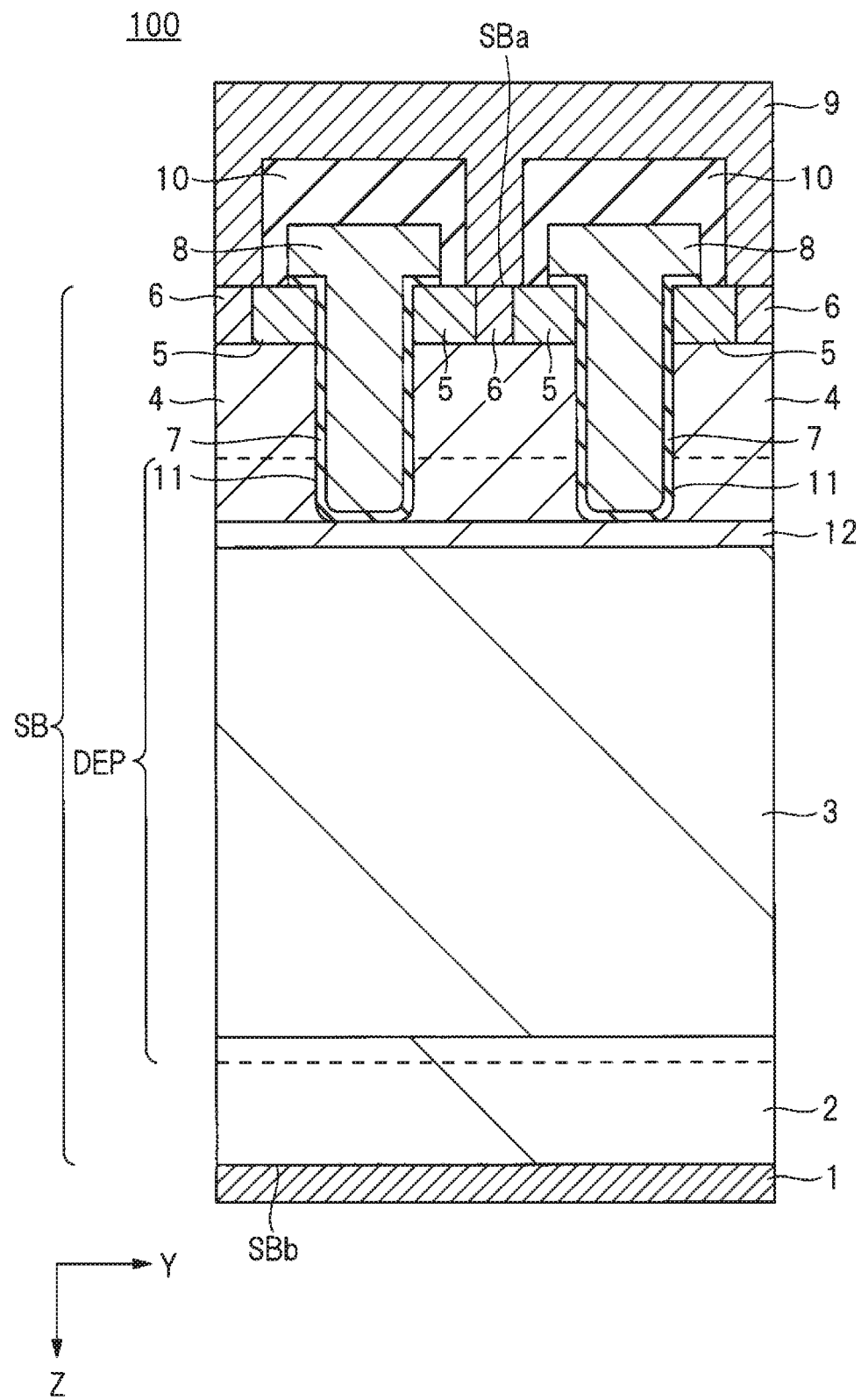
FIG. 7 is a schematic view showing a depletion layer during an OFF operation of the semiconductor device according to Example 1.
Figure 8:
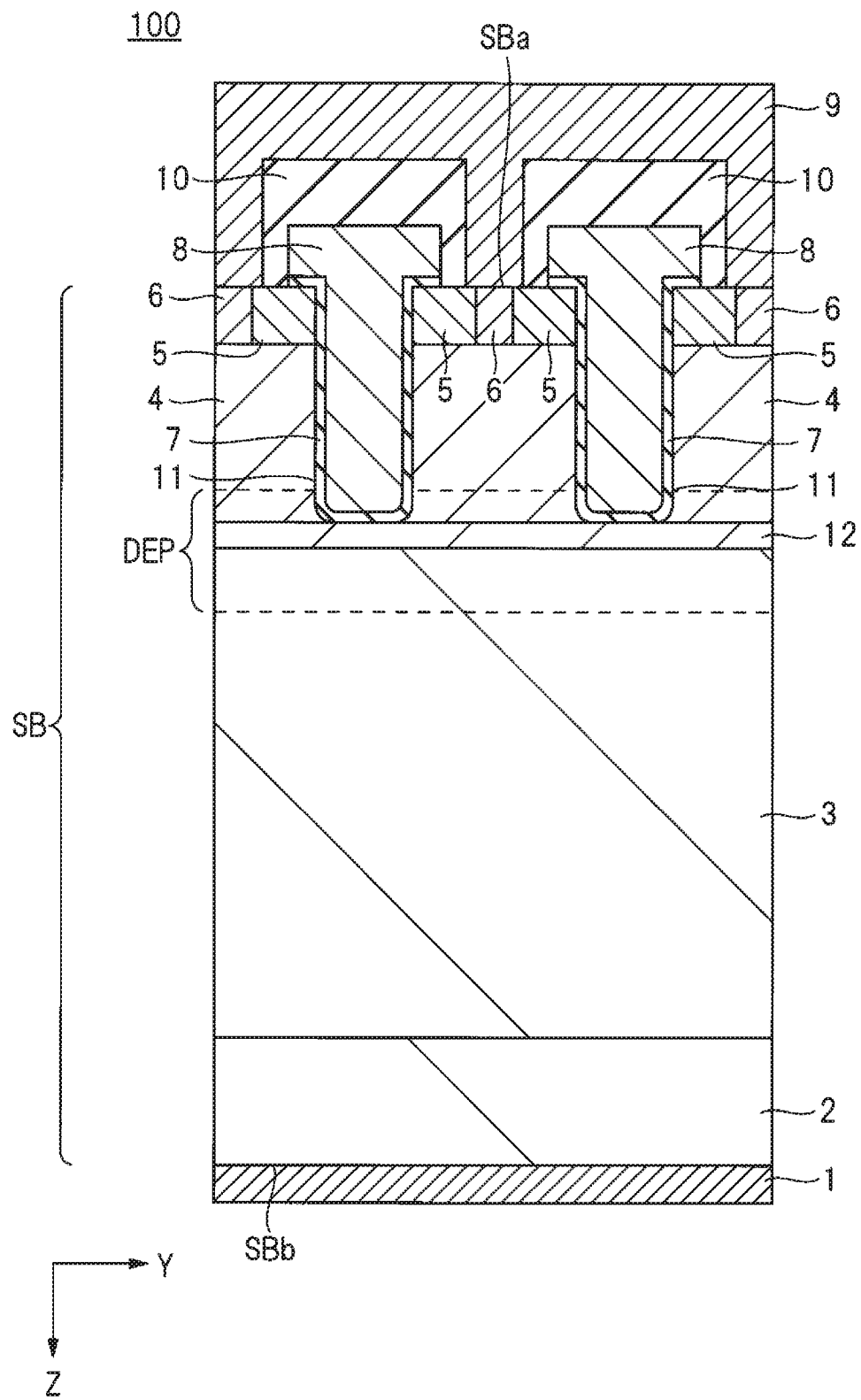
FIG. 8 is a schematic view showing a depletion layer during an ON operation of the semiconductor device according to Example 1.

FIG. 5 is an equivalent circuit diagram of the semiconductor device 100 (transistor) according to Example 1. FIG. 6 is a table showing an example of the operating voltage of the semiconductor device (transistor) 100. FIG. 7 is a schematic view showing a depletion layer during the OFF operation of the semiconductor device (transistor) 100 according to Example 1. FIG. 8 is a schematic view showing a depletion layer during the ON operation of the semiconductor device (transistor) 100 according to Example 1.

As shown in FIG. 5, the transistor includes a source S, a drain D, and a gate G. The gate G, the source S, and the drain D respectively correspond to the gate electrode 8 of FIG. 3, the source region 5 (and the source electrode 9) of FIG. 3, and the drift region 3 and the drain region 2 (and the drain electrode 1) of FIG. 3.

For example, by applying a voltage shown in FIG. 6 to the source S, the drain D, and the gate G of the transistor, a desired current flows between the source S and the drain D during the ON operation (ON), and a voltage between the source S and the drain D is blocked during the OFF operation (OFF). That is, the transistor functions as a switching element.

During the OFF operation (OFF), a high voltage (for example, 600 V) is applied to the drain D by a load connected to the drain D. As shown in FIG. 7, a reverse bias is applied between the drain electrode 1 and the source electrode 9, and a depletion layer DEP is formed in the body region 4, the electric field relaxation layer 12, the drift region 3, and the drain region 2. Here, the impurity concentrations of the body region 4 and the electric field relaxation layer 12 are higher than the impurity concentration of the drift region 3, so that the depletion layer DEP mostly extends to the drift region 3 side, and a part of the depletion layer DEP also extends to the drain region 2. According to Example 1, since the entire lower parts of the groove 11, the source region 5, and the body connecting region 6 are covered with the electric field relaxation layer 12, the depletion layer DEP is deeply and widely formed in the lower part of the groove 11 as compared with the case where the electric field relaxation layer 12 is not formed or the case where the electric field relaxation layer 12 is formed in a part of the groove 11, so that the electric field applied to the gate insulating film 7 is relaxed. Therefore, the withstand voltage of the gate insulating film 7 is improved, and the leakage current of the gate insulating film 7 is also reduced. The reliability of the gate insulating film 7 is improved.

"The entire lower part of the groove 11" means the entire body region 4 in plan view as described with reference to FIGS. 1 to 4. That is, the electric field relaxation layer 12 extends below the body region 4 and over the entire body region 4. In other words, as shown in FIG. 4, the electric field relaxation layer 12 continuously extends in a region below the groove 11 and a region between the two grooves 11 in the X direction. Furthermore, as shown in FIG. 3, the electric field relaxation layer 12 continuously extends below each groove 11, below the source region 5, and below the body connecting region 6.

When a voltage shown in FIG. 6 is applied to the drain D, the source S, and the gate G of the transistor during the ON operation (ON), the depletion layer DEP spreads in the body region 4, the electric field relaxation layer 12, and the drift region 3 as shown in FIG. 8. In the depth (Z) direction, it is desirable that the entire electric field relaxation layer 12 below the groove 11 is depleted. This is because, if a p-type neutral region is present between the lower part of the groove 11 and the drift region 3, a potential barrier from a channel formed in the body region 4 in contact with the gate insulating film 7 to an electric charge flowing in the drift region 3 increases, which causes increased ON resistance. Therefore, it is desirable that the thickness of the electric field relaxation layer 12 below the groove 11 is equal to or less than the thickness of the depletion layer formed in a thermal equilibrium state. When this condition is satisfied, the depletion layer spreads wider than in the thermal equilibrium state during the ON operation of the transistor, so that the entire electric field relaxation layer 12 below the groove 11 is guaranteed to be depleted.

Thus, the electric field relaxation layer 12 is continuously formed over the entire body region 4, so that the reliability of the gate insulating film 7 during the OFF operation can be improved. The entire electric field relaxation layer 12 is depleted during the ON operation of the transistor, so that the reduction of the ON current of the transistor can be suppressed. That is, the reliability of the transistor can be improved.

<Method for Manufacturing Semiconductor Device>

Next, a method for manufacturing a semiconductor device of Example 1 will be described with reference to FIGS. 9 to 15. Each of FIGS. 9 to 15 is a cross-sectional view of the semiconductor device according to Example 1 during the manufacturing step thereof. FIGS. 9 to 15 correspond to the cross-sectional view of FIG. 3.

Figure 9:
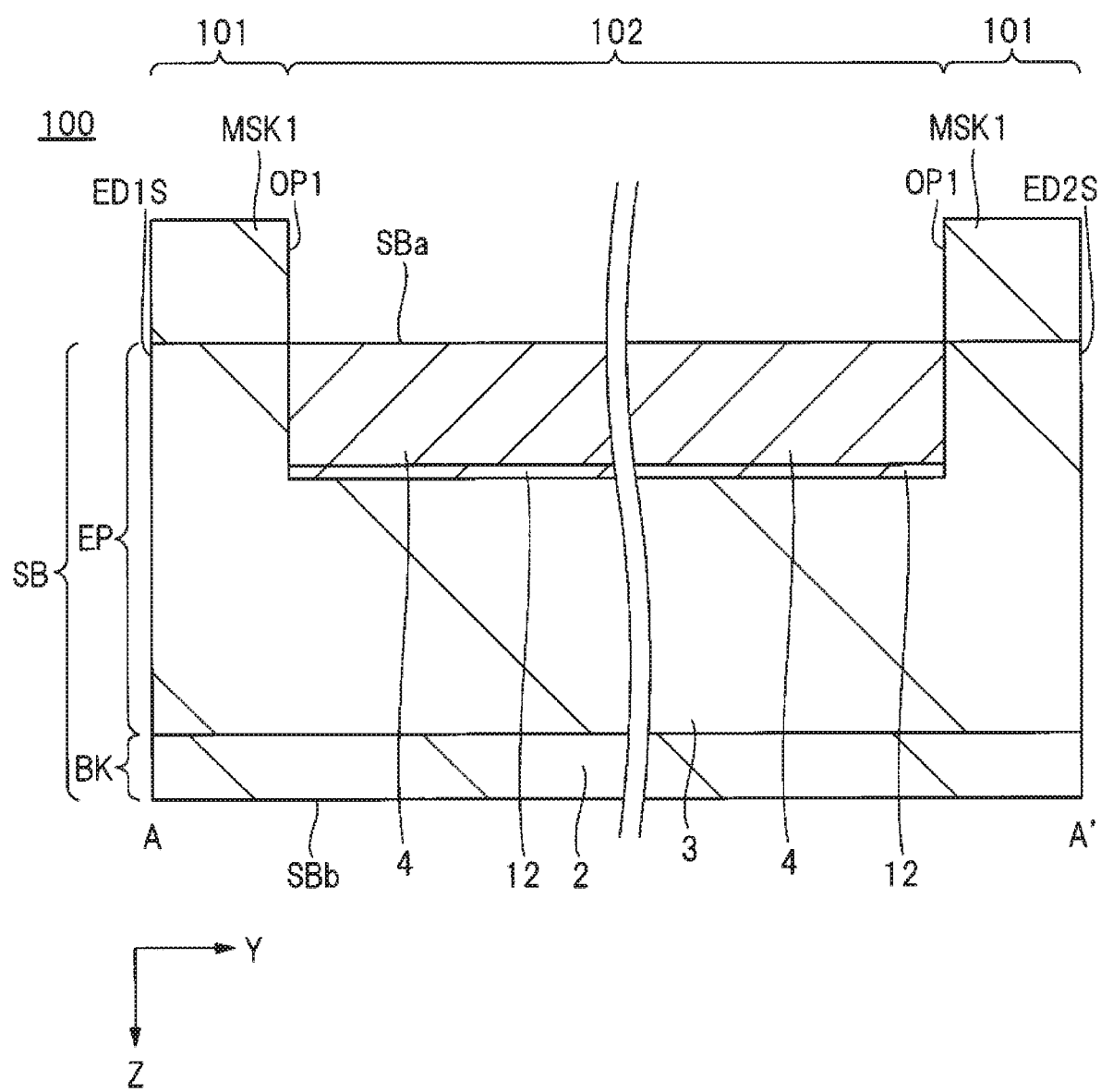
FIG. 9 is a cross-sectional view of the semiconductor device according to Example 1 during the manufacturing step thereof.

First, a step of preparing a semiconductor substrate SB is carried out. As shown in FIG. 9, the semiconductor substrate SB is composed of a bulk substrate BK and an epitaxial layer EP formed on the bulk substrate BK. In the bulk substrate BK, an n-type drain region 2 is formed, and in the epitaxial layer EP, an n-type drift region 3 is formed. The semiconductor substrate SB is made of silicon carbide (SiC).

Next, steps of forming an electric field relaxation layer 12 and a body region 4 are carried out. As shown in FIG. 9, a mask layer MSK1 which covers a termination region 101 and has an opening OP1 exposing an active region 102 is formed on a main surface SBa of the semiconductor substrate SB. Impurities such as aluminum or boron are ion-implanted into a region exposed from the mask layer MSK1 to form the electric field relaxation layer 12 and the body region 4. The electric field relaxation layer 12 is in contact with the body region 4, and located below the body region 4.

Figure 10:
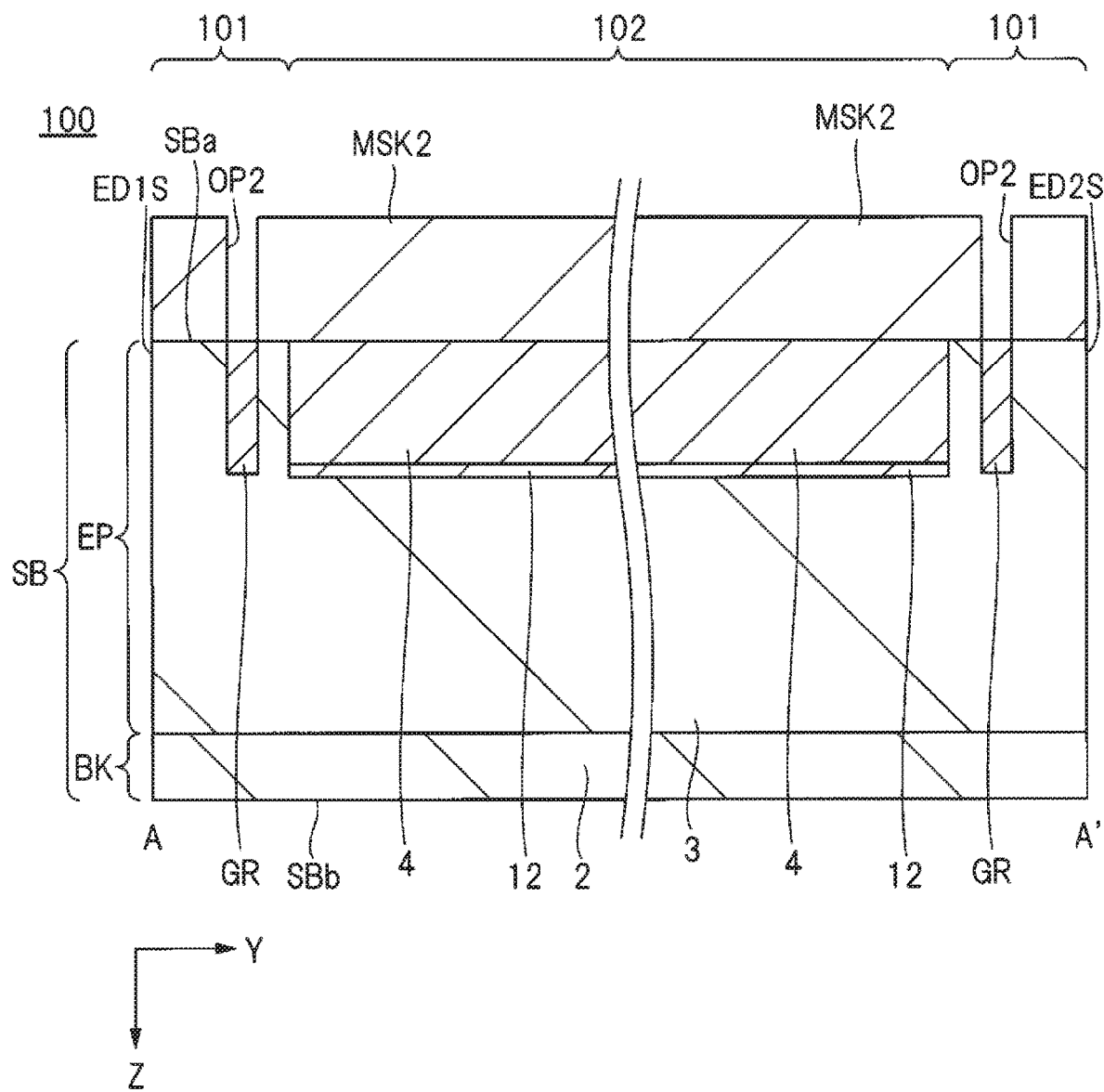
FIG. 10 is a cross-sectional view of the semiconductor device according to Example 1 during the manufacturing step thereof.

Next, a step of forming a guard ring GR is carried out. As shown in FIG. 10, a mask layer MSK2 which covers the active region 102 and has an opening OP2 exposing a part of the termination region 101 is formed on the main surface SBa of the semiconductor substrate SB. Impurities such as aluminum or boron are ion-implanted into a region exposed from the mask layer MSK2 to form the guard ring GR.

Figure 11:
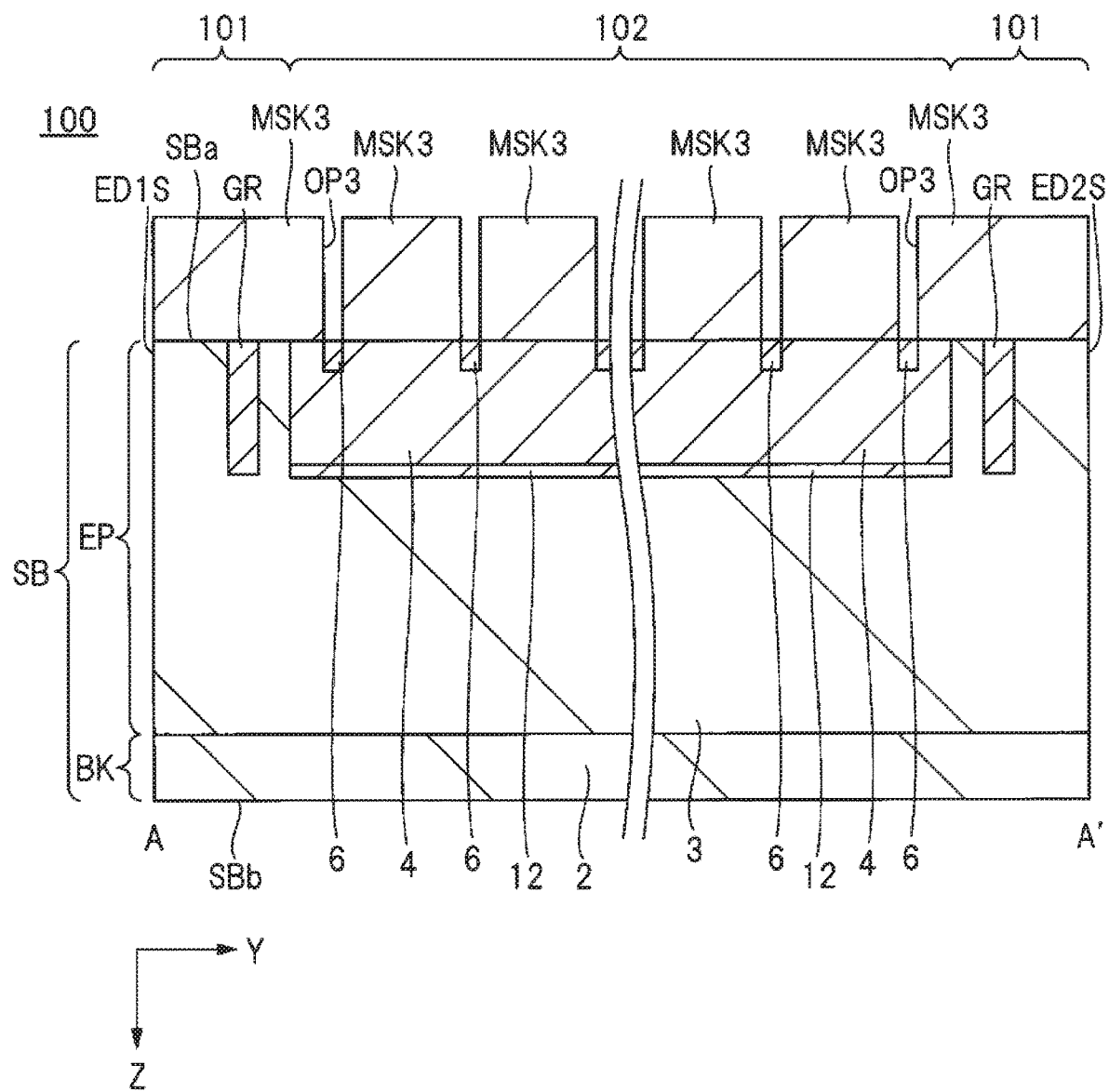
FIG. 11 is a cross-sectional view of the semiconductor device according to Example 1 during the manufacturing step thereof.

Next, a step of forming a body connecting region 6 is carried out. As shown in FIG. 11, a mask layer MSK3 which covers the termination region 101 and has a plurality of openings OP3 at predetermined intervals in the active region 102 is formed on the main surface SBa of the semiconductor substrate SB. Impurities such as aluminum or boron are ion-implanted into a region exposed from the mask layer MSK3 to form the body connecting region 6.

Figure 12:
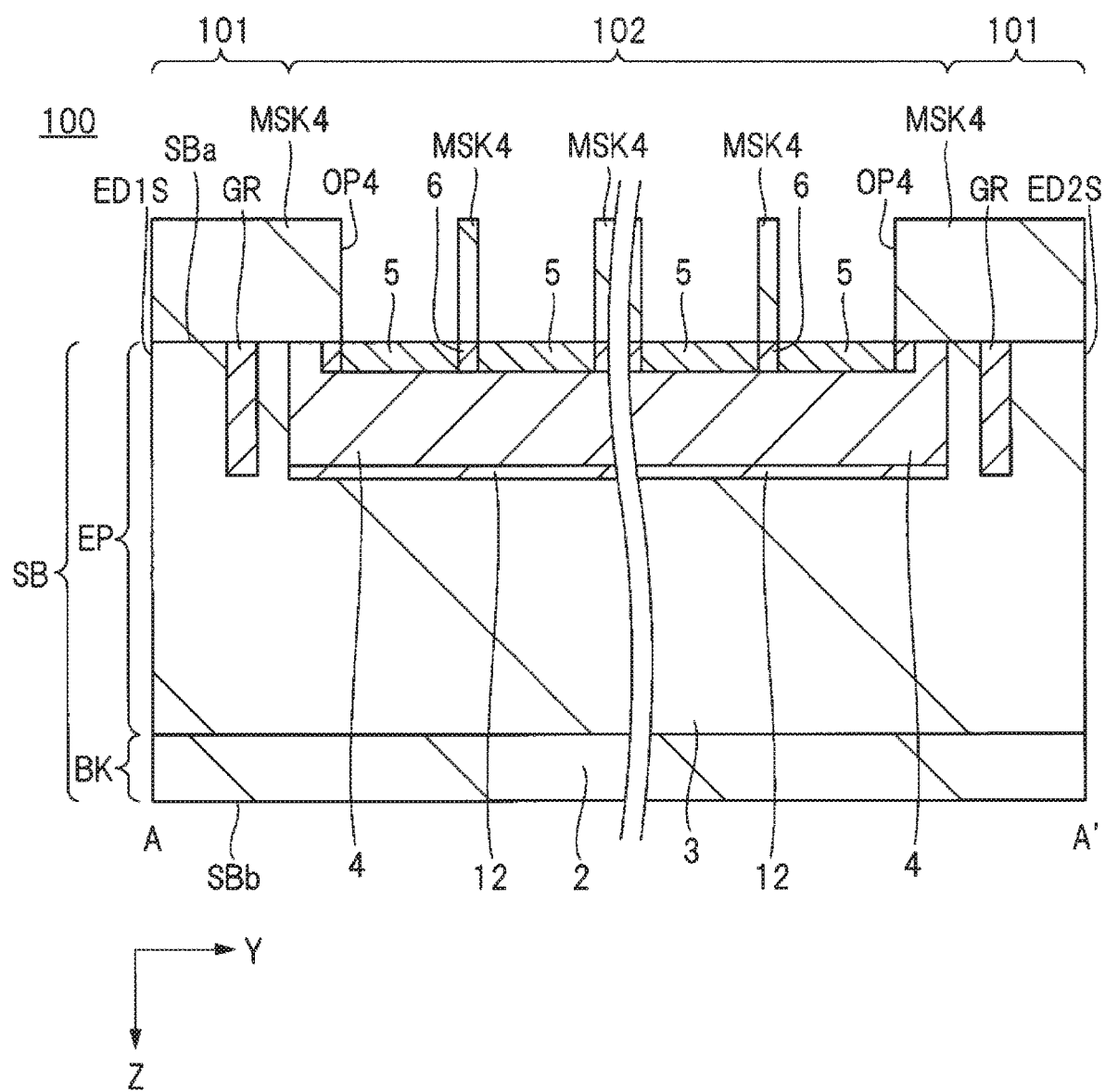
FIG. 12 is a cross-sectional view of the semiconductor device according to Example 1 during the manufacturing step thereof.

Next, a step of forming a source region 5 is carried out. As shown in FIG. 12, a mask layer MSK4 which covers the termination region 101 and has a plurality of openings OP4 at predetermined intervals in the active region 102 is formed on the main surface SBa of the semiconductor substrate SB. In the active region 102, the mask layer MSK4 covers the body connecting region 6. Impurities such as nitrogen or phosphorus are ion-implanted into a region exposed from the mask layer MSK4 to form the source region 5.

Here, the mask layers MSK1, MSK2, MSK3, and MSK4 are, for example, organic insulating films such as a photoresist film. The formation order of the above-described electric field relaxation layer 12, body region 4, guard ring GR, body connecting region 6, and source region 5 is not limited.

Next, an annealing step is carried out. After removing the mask layer MSK4, a protective film (not shown) made of, for example, carbon is formed on the main surface SBa of the semiconductor substrate SB, and an annealing treatment is performed at 1700° C. to 1900° C., for example. The impurities introduced by the ion implantation are activated. The protective film prevents the carbon rich main surface SBa caused by the vaporization of silicon (Si) from the surface SBa of the semiconductor substrate SB made of silicon carbide (SiC). After the annealing treatment, for example, the protective film is removed using an oxygen plasma treatment.

Figure 13:
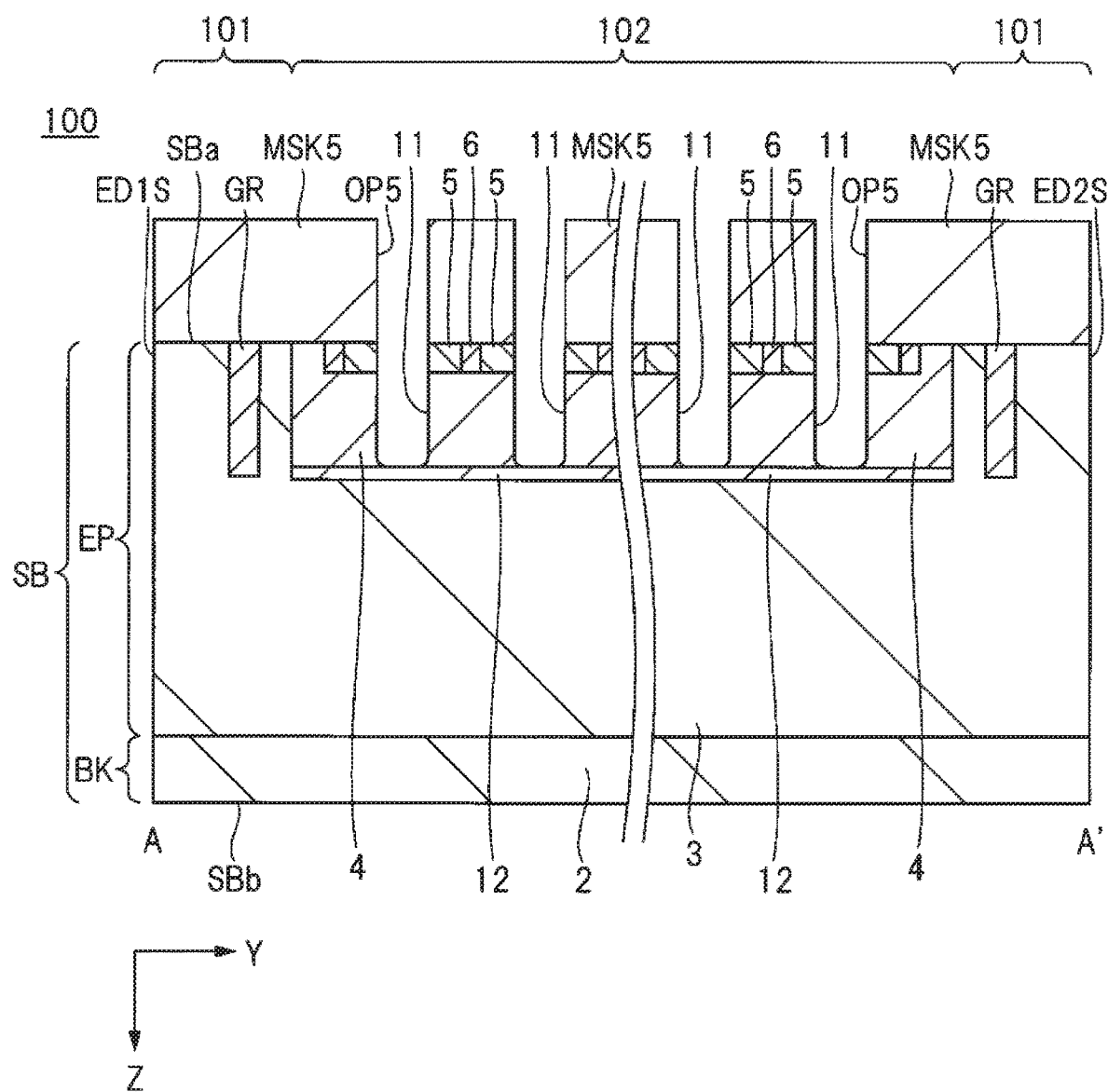
FIG. 13 is a cross-sectional view of the semiconductor device according to Example 1 during the manufacturing step thereof.

Next, a step of forming a groove 11 is carried out. As shown in FIG. 13, a mask layer MSK5 which covers the termination region 101 and has a plurality of openings OP5 at predetermined intervals in the active region 102 is formed on the main surface SBa of the semiconductor substrate SB. The mask layer MSK5 is made of, for example, a silicon oxide film or a silicon nitride film. By subjecting the semiconductor substrate SB to a dry etching treatment, the groove 11 is formed at a position corresponding to the opening OP5. The opening OP5 exposes the source region 5 formed in the step of forming the source region 5 in FIG. 12. The depth of the groove 11 is, for example, 1 µm, passes through the source region 5 and the body region 4, and reaches the electric field relaxation layer 12, but it does not pass through the electric field relaxation layer 12.

Figure 14:
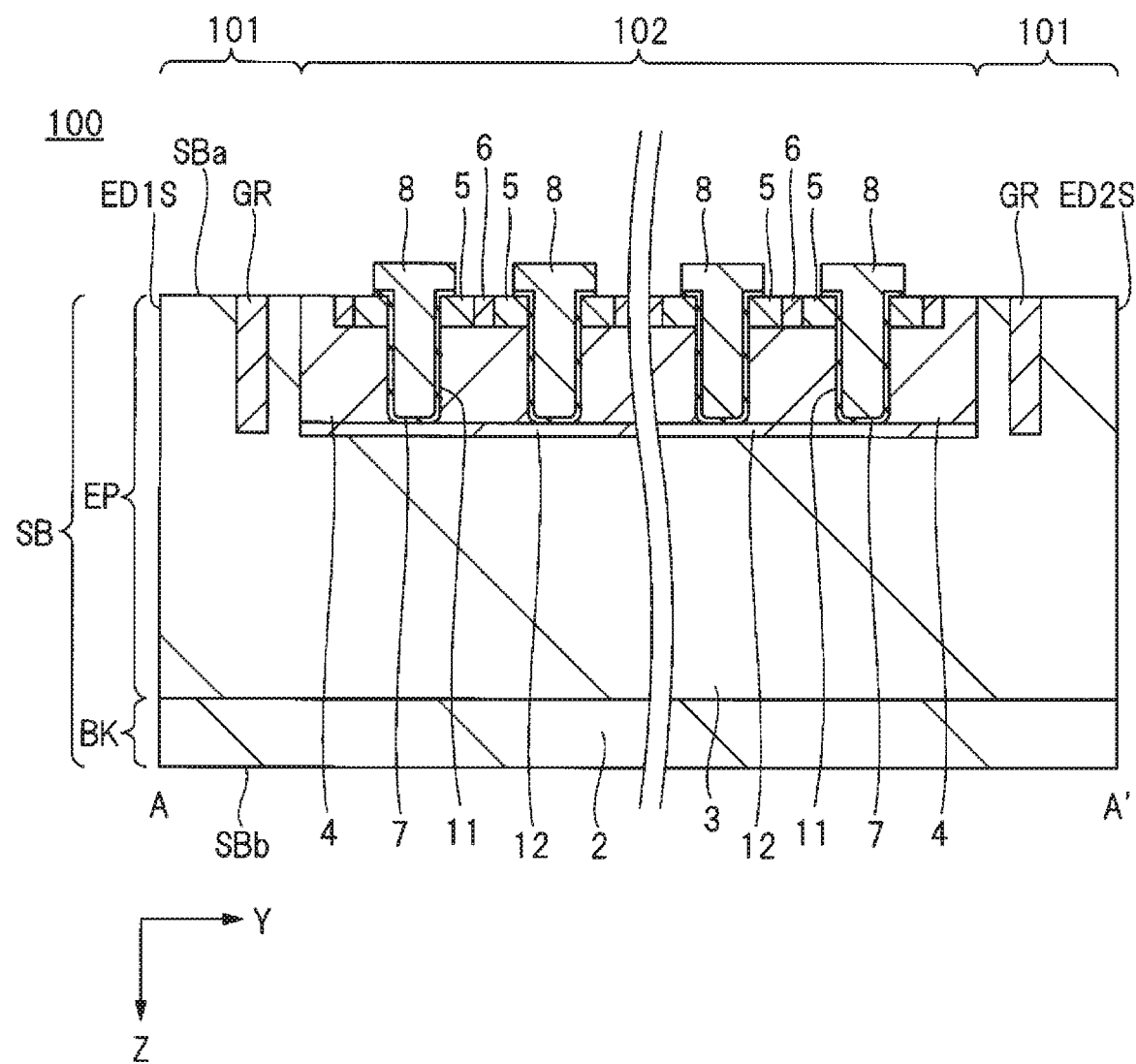
FIG. 14 is a cross-sectional view of the semiconductor device according to Example 1 during the manufacturing step thereof.

Next, steps of forming a gate insulating film 7 and a gate electrode 8 are carried out. As shown in FIG. 14, a gate insulating film 7 composed of an insulating film such as a silicon oxide film, for example, is formed on the inner wall of the groove 11. The gate insulating film 7 is formed by, for example, wet oxidation, dry oxidation or a chemical vapor deposition (CVD) method. Next, a gate electrode 8 composed of a conductive film such as a polysilicon film, for example, is formed on the gate insulating film 7 in the groove 11. A polysilicon film is deposited in the groove 11 and on the main surface SBa of the semiconductor substrate SB with the gate insulating film 7 interposed therebetween by the CVD method. The gate electrode 8 is formed by patterning so as to leave the polysilicon film in the groove 11 and on the main surface SBa on both sides of the groove 11.

Figure 15:
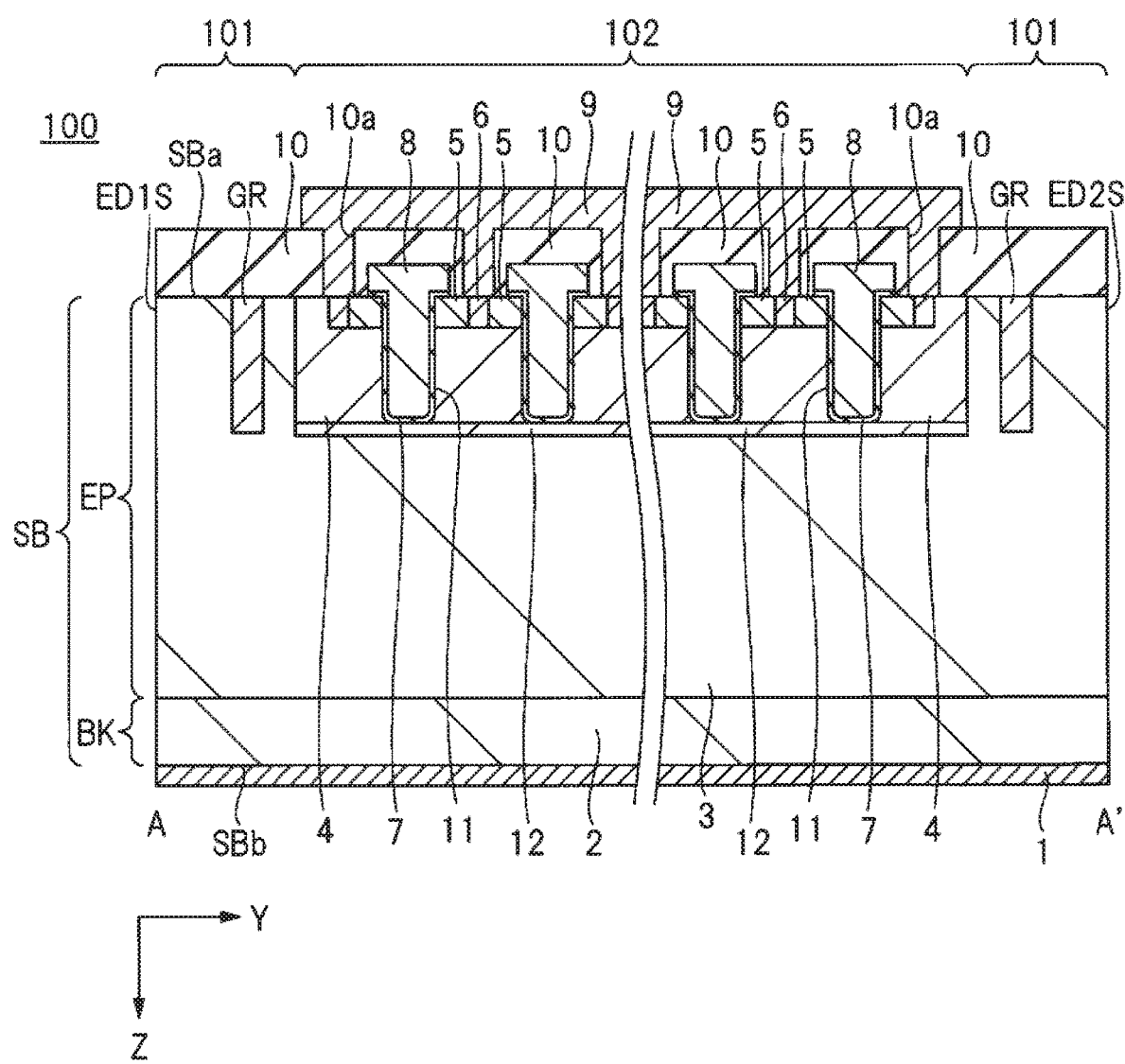
FIG. 15 is a cross-sectional view of the semiconductor device according to Example 1 during the manufacturing step thereof.

Next, a step of forming an interlayer insulating film 10 and a source electrode 9 is carried out. As shown in FIG. 15, the interlayer insulating film 10 is formed on the main surface SBa so as to cover the gate electrode 8. The interlayer insulating film 10 is composed of, for example, a silicon oxide film formed by a CVD method. After depositing the silicon oxide film, a plurality of openings 10a exposing a part of the source region 5 and the body connecting region 6 are formed, and the interlayer insulating film 10 is formed. Subsequently, after a metal conductor film is deposited on the interlayer insulating film 10 and in the openings 10a, the metal conductor film is patterned into a desired pattern to form the source electrode 9. The metal conductor film is composed of, for example, an aluminum film, a titanium film, a nickel film, or a gold film.

According to the manufacturing method of Example 1, the electric field relaxation layer 12 is formed by using the mask layer MSK1 for forming the body region 4, so that the number of masks can be reduced. In other words, it is possible to eliminate a mask layer forming step for forming the electric field relaxation layer 12. In the aforementioned JP 2012-169386 A, a dedicated mask for forming the p-type deep layer (10) and a dedicated mask forming step are required.

According to the manufacturing method of Example 1, after forming the electric field relaxation layer 12, the body region 4, the guard ring GR, the body connecting region 6, and the source region 5, a step of forming the groove 11 is carried out. That is, an activation annealing step of the ion-implanted impurities can be carried out before the step of forming the groove 11. Since the protective film is formed on the main surface SBa of the flat semiconductor substrate SB, the protective film is easily removed, which can provide improved reliability and manufacturing yield of the semiconductor device. In the aforementioned JP 2015-128184 A, after forming a trench (18), an electric field relaxation region (20) is ion-implanted, and an annealing step is then carried out. A filling material (32) is formed in the trench (18) in the annealing step, which causes concerned defects in which the filling material (32) remains in the trench (18) in the step of removing the filling material (32).

Example 2

Figure 16:
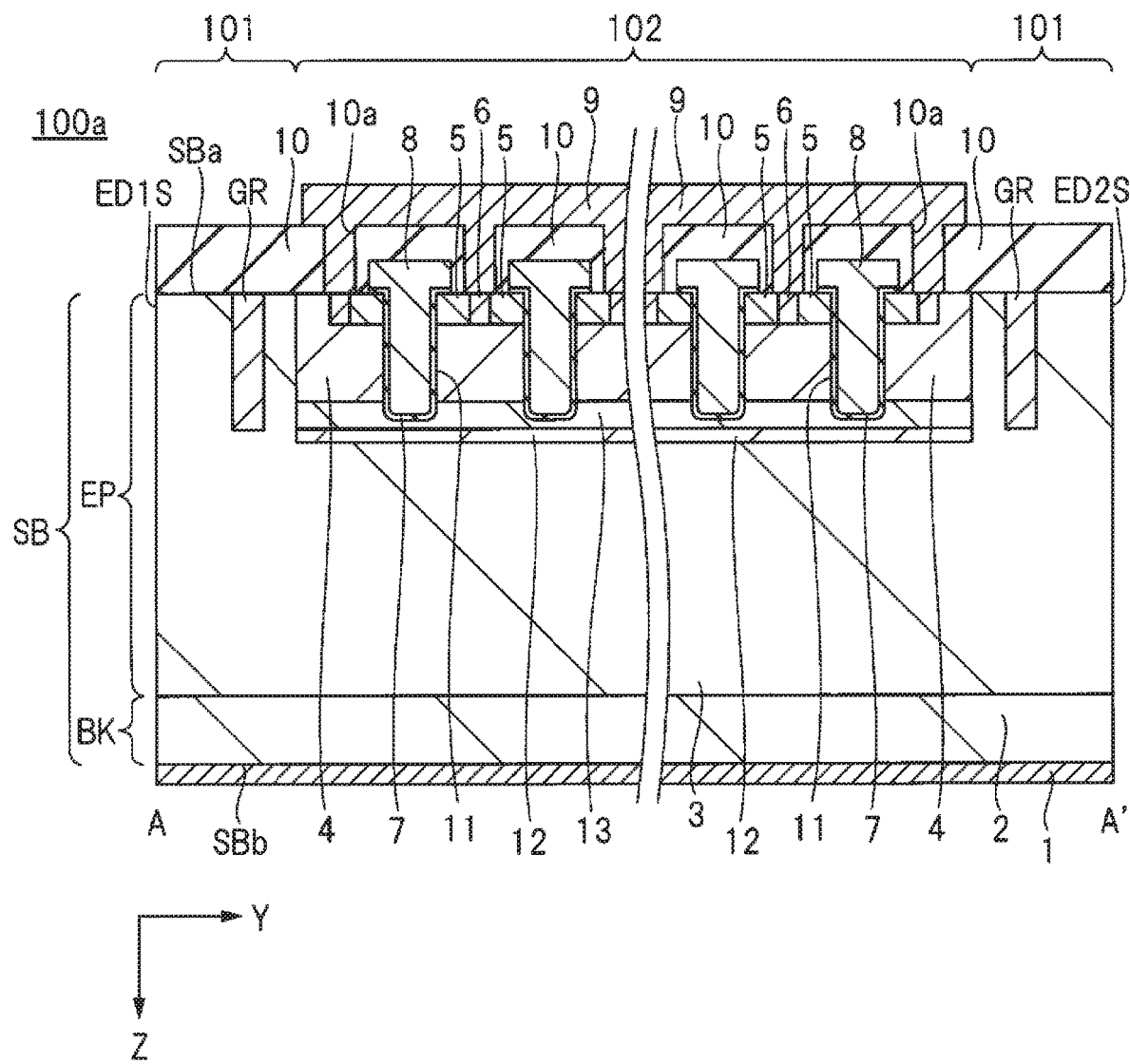
FIG. 16 is a cross-sectional view of a semiconductor device according to Example 2.
Figure 17:
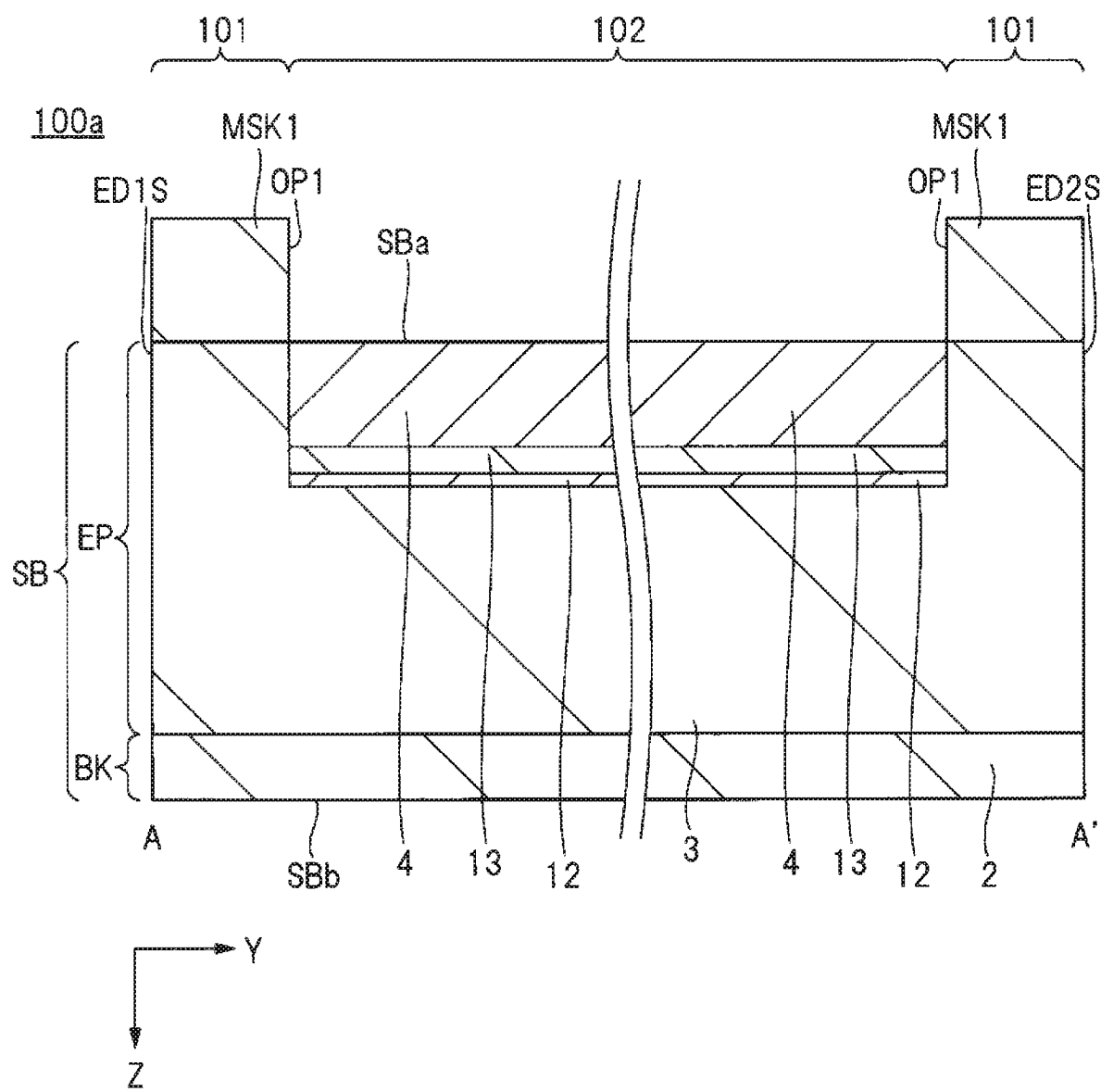
FIG. 17 is a cross-sectional view of the semiconductor device of Example 2 during the manufacturing step thereof.

A semiconductor device 100a according to Example 2 is modification of Example 1, and the same reference numerals are assigned to structures common to those of Example 1. FIG. 16 is a cross-sectional view of the semiconductor device 100a according to Example 2. FIG. 17 is a cross-sectional view of the semiconductor device 100a according to Example 2 during the manufacturing step thereof.

As shown in FIG. 16, in Example 2, an n-type semiconductor region 13 is interposed between a body region 4 and an electric field relaxation layer 12. A groove 11 passes through the body region 4, and reaches the n-type semiconductor region 13, but it does not reach the electric field relaxation layer 12. The lower end (tip) of the groove 11 terminates in the n-type semiconductor region 13 in a depth direction (Z direction). As shown in FIG. 17, the n-type semiconductor region 13 is formed by implanting the n-type impurities into a semiconductor substrate SB using the mask layer MSK1 according to Example 1. Therefore, the n-type semiconductor region 13 is continuously formed over the entire body region 4, as with the electric field relaxation layer 12. The formation order of the body region 4, the electric field relaxation layer 12, and the n-type semiconductor region 13 is not particularly limited. The structures other than the n-type semiconductor region 13 are the same as those in the manufacturing method according to Example 1.

In Example 2, even if the depth of the groove 11 varies, the lower end (tip) of the groove 11 terminates in the n-type semiconductor region 13, and does not reach the electric field relaxation layer 12. That is, the processing variation of a dry etching step for forming the groove 11 does not affect the thickness of the electric field relaxation layer 12, which provides high controllability of the thickness of the electric field relaxation layer 12.

The n-type semiconductor region 13 is formed by using the mask layer MSK1 for forming the electric field relaxation layer 12 and the body region 4, so that the number of masks can be reduced. In other words, it is possible to eliminate a mask layer forming step for forming the n-type semiconductor region 13.

Example 3

Figure 18:
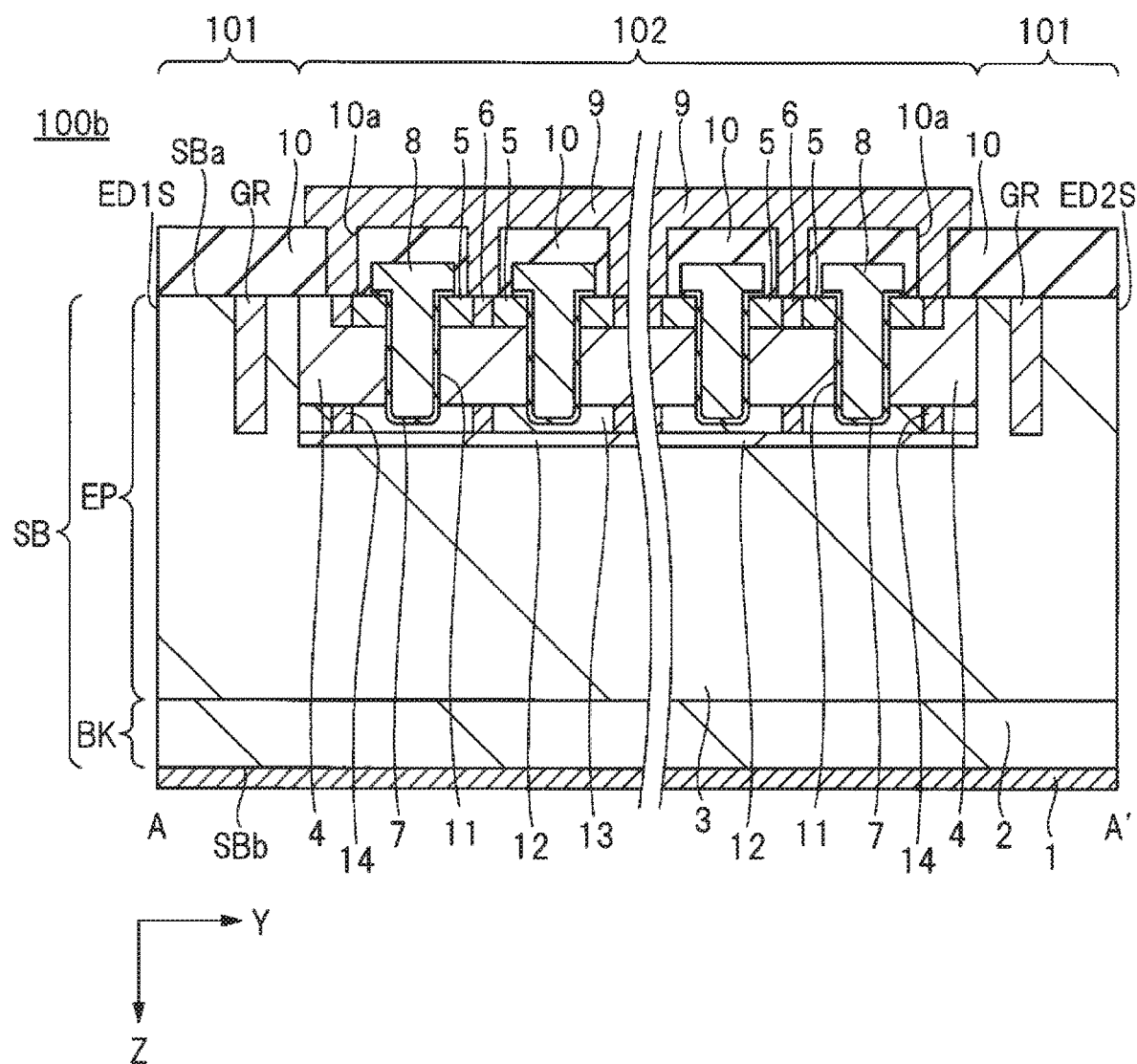
FIG. 18 is a cross-sectional view of a semiconductor device according to Example 3.
Figure 19:
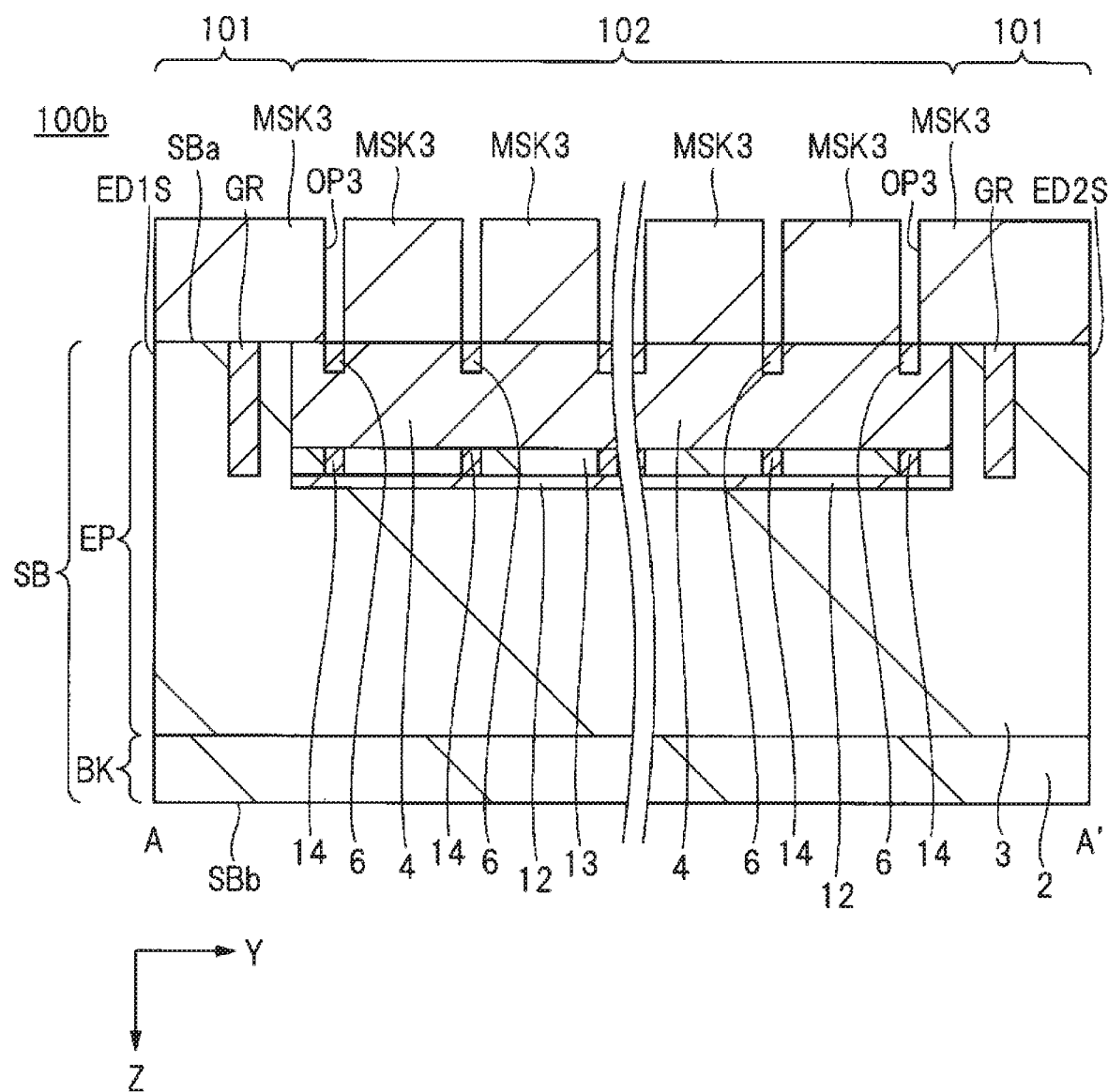
FIG. 19 is a cross-sectional view of the semiconductor device of Example 3 during the manufacturing step thereof.

A semiconductor device 100b according to Example 3 is modification of Example 2, and the same reference numerals are assigned to structures common to those of Examples 1 and 2. FIG. 18 is a cross-sectional view of the semiconductor device 100b according to Example 3. FIG. 19 is a cross-sectional view of the semiconductor device 100b according to Example 3 during the manufacturing step thereof.

As shown in FIG. 18, in Example 3, a plurality of p-type semiconductor regions 14 connecting a p-type electric field relaxation layer 12 and a p-type body region 4 are formed in an n-type semiconductor region 13. In Example 3, the electric field relaxation layer 12 is electrically connected to the body region 4, and the electric field relaxation layer 12 also has a potential equal to that of the body region 4. On the other hand, in Example 2, the electric field relaxation layer 12 has a floating potential. Therefore, in Example 3, as compared to Example 2, the electric field relaxation layer 12 can be easily depleted when a trench gate type power MOSFET is ON. The operation of the trench gate type power MOSFET can be stabilized.

As shown in FIG. 19, the p-type semiconductor region 14 is formed by implanting the aforementioned p-type impurities into a semiconductor substrate SB using the mask layer MSK3 according to Example 1. The p-type semiconductor region 14 is formed by using a mask layer MSK3 forming a body connecting region 6, so that the number of masks can be reduced. In other words, it is possible to eliminate a mask layer forming step for forming the p-type semiconductor region 14. Either one of the p-type semiconductor region 14 and the body connecting region 6 may be first formed. The structures other than the p-type semiconductor region 14 are the same as those in the manufacturing method according to Example 2.

Example 4

Figure 20:
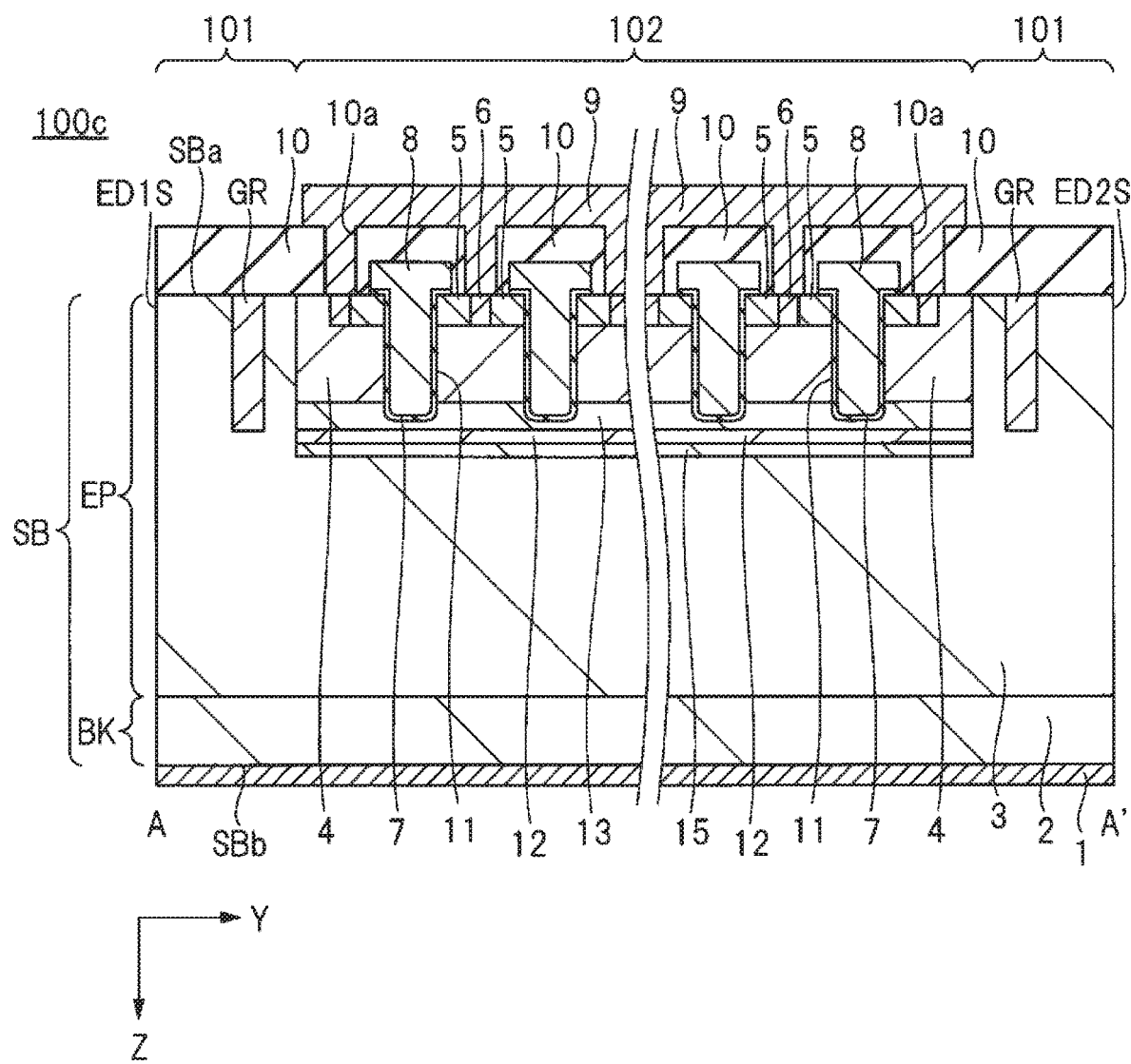
FIG. 20 is a cross-sectional view of a semiconductor device according to Example 4.
Figure 21:
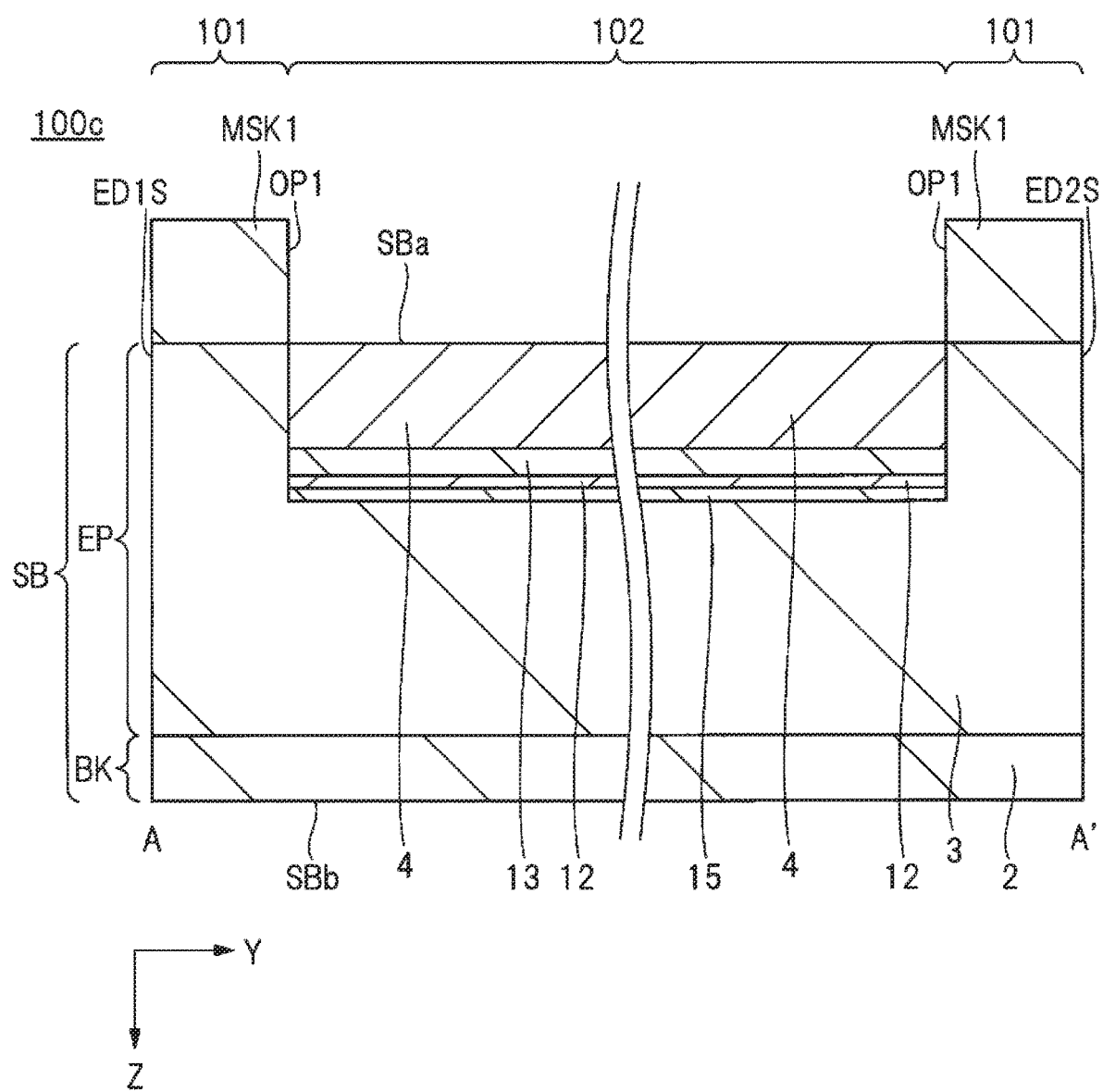
FIG. 21 is a cross-sectional view of the semiconductor device of Example 4 during the manufacturing step thereof.

A semiconductor device 100c according to Example 4 is modification of Example 2, and the same reference numerals are assigned to structures common to those of Examples 1 and 2. FIG. 20 is a cross-sectional view of the semiconductor device 100c according to Example 4. FIG. 21 is a cross-sectional view of the semiconductor device 100c according to Example 4 during the manufacturing step thereof.

As shown in FIG. 20, in Example 4, an n-type semiconductor region 15 is formed below an electric field relaxation layer 12 so as to be in contact with the electric field relaxation layer 12. As shown in FIG. 21, the n-type semiconductor region 15 is formed by implanting the n-type impurities into a semiconductor substrate SB using the mask layer MSK1 according to Example 1. Therefore, the n-type semiconductor region 15 is continuously formed over the entire body region 4, as with the electric field relaxation layer 12.

The impurity concentration of the n-type semiconductor region 15 is, for example, $2 \times 10^{16}$ cm$^{-3}$ or more, and higher than the impurity concentration of a drift region 3. By providing the n-type semiconductor region 15 having a higher concentration than that of the drift region 3 below the electric field relaxation layer 12 so as to be in contact with the electric field relaxation layer 12, it is possible to reduce the thickness of the electric field relaxation layer 12. In other words, it is possible to prevent the thickness of the electric field relaxation layer 12 from being increased. For example, when the electric field relaxation layer 12 is formed using ion implantation, an impurity profile in a depth direction (Z direction) has a distribution similar to a Gaussian distribution. Therefore, when the difference between the impurity concentration of the electric field relaxation layer 12 and the impurity concentration of the drift region 3 is increased, a skirt portion of the implantation profile is not compensated by the impurities of the drift region 3, so that the thickness of the electric field relaxation layer 12 is increased. In Example 4, the extension of the electric field relaxation layer 12 can be prevented by providing the n-type semiconductor region 15 having a high concentration below the electric field relaxation layer 12. In other words, the thickness of the electric field relaxation layer 12 can be controlled with higher accuracy.

The formation order of the body region 4, the electric field relaxation layer 12, the n-type semiconductor region 13, and the n-type semiconductor region 15 is not particularly limited. The structures other than the n-type semiconductor region 15 are the same as those in the manufacturing method according to Example 2.

The n-type semiconductor region 15 according to Example 4 may be applied to Example 1 or 3.

Example 5

Figure 22:
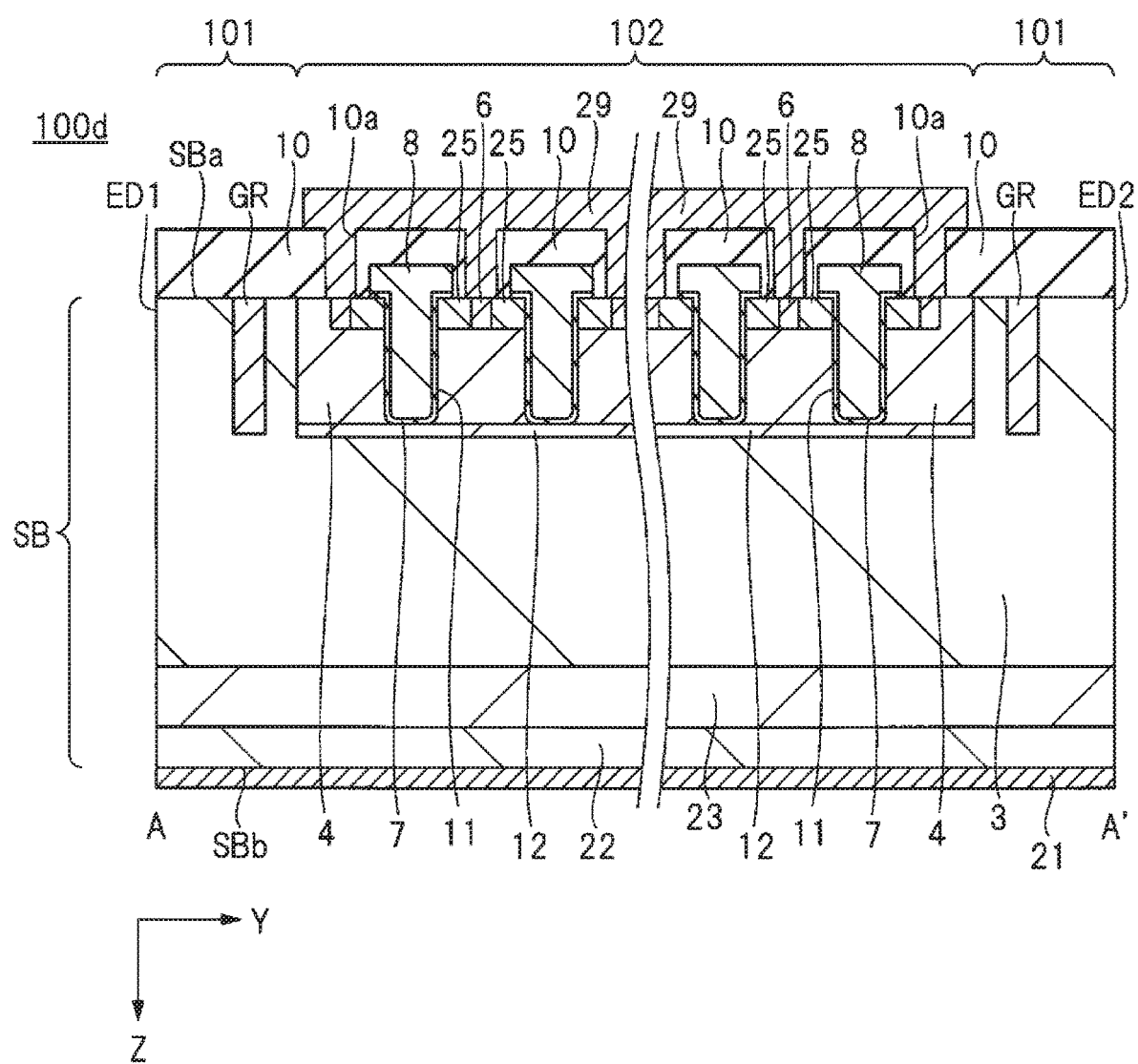
FIG. 22 is a cross-sectional view of a semiconductor device according to Example 5.
Figure 23:
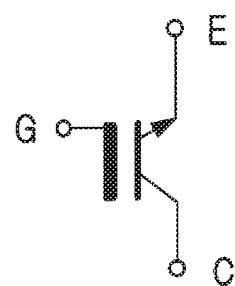
FIG. 23 is an equivalent circuit diagram of the semiconductor device of Example 5.

A semiconductor device 100$d$ according to Example 5 is modification of Example 1, and the electric field relaxation layer 12 according to Example 1 is applied to an IGBT. FIG. 22 is a cross-sectional view of the semiconductor device 100$d$ according to Example 5, and the semiconductor device 100$d$ is an IGBT. FIG. 23 is an equivalent circuit diagram of the semiconductor device (IGBT) according to Example 5.

As shown in FIG. 23, the IGBT includes a collector C, an emitter E, and a gate G. The correspondence between FIGS. 3 and 22 will be described. A drain electrode 1, a drain region 2, a source electrode 9, and a source region 5 in FIG. 3 are read as a collector electrode 21, a collector region 22, an emitter electrode 29, and an emitter region 25 in FIG. 22. In the semiconductor device 100$d$ of FIG. 22, an n-type buffer region 23 is additionally formed between the collector region 22 and a drift region 3. Therefore, the description of Example 1 can be read as the description of Example 5.

The impurity concentration of the buffer region 23 is higher than the impurity concentration of the drift region 3, which provides improved withstand voltage of the IGBT and suppressed conduction loss. However, the buffer region 23 is not indispensable, and may be omitted.

Example 6

Figure 24:
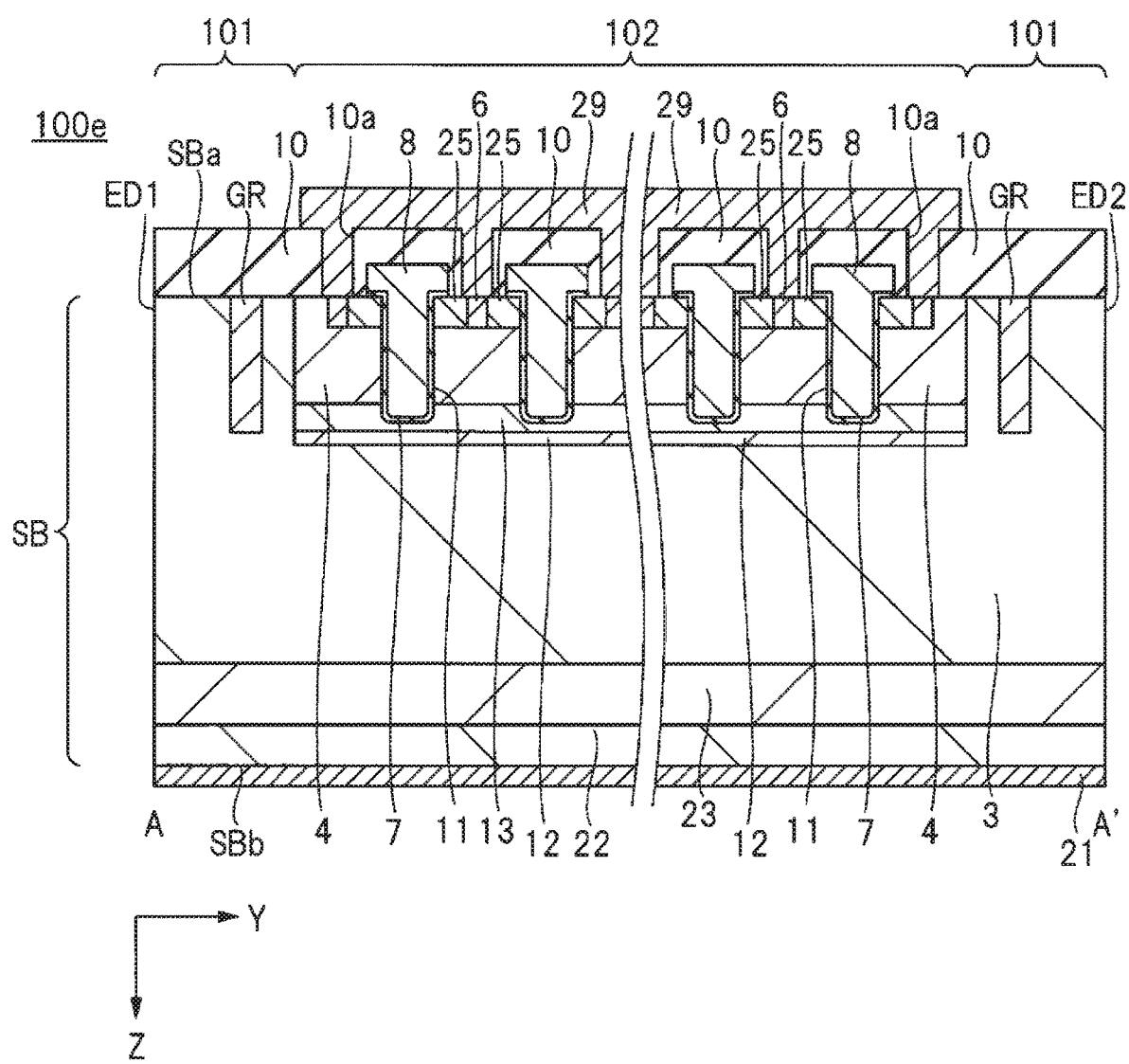
FIG. 24 is a cross-sectional view of a semiconductor device according to Example 6.

A semiconductor device 100$e$ according to Example 6 is modification of Example 5, and an n-type semiconductor region 13 is provided in Example 5. FIG. 24 is a cross-sectional view of the semiconductor device 100$e$ according to Example 6, and the semiconductor device 100$e$ is an IGBT. By the correspondence of Example 5 and the addition of a buffer region 23, Example 6 can be described from the description of Example 2.

Example 7

Figure 25:
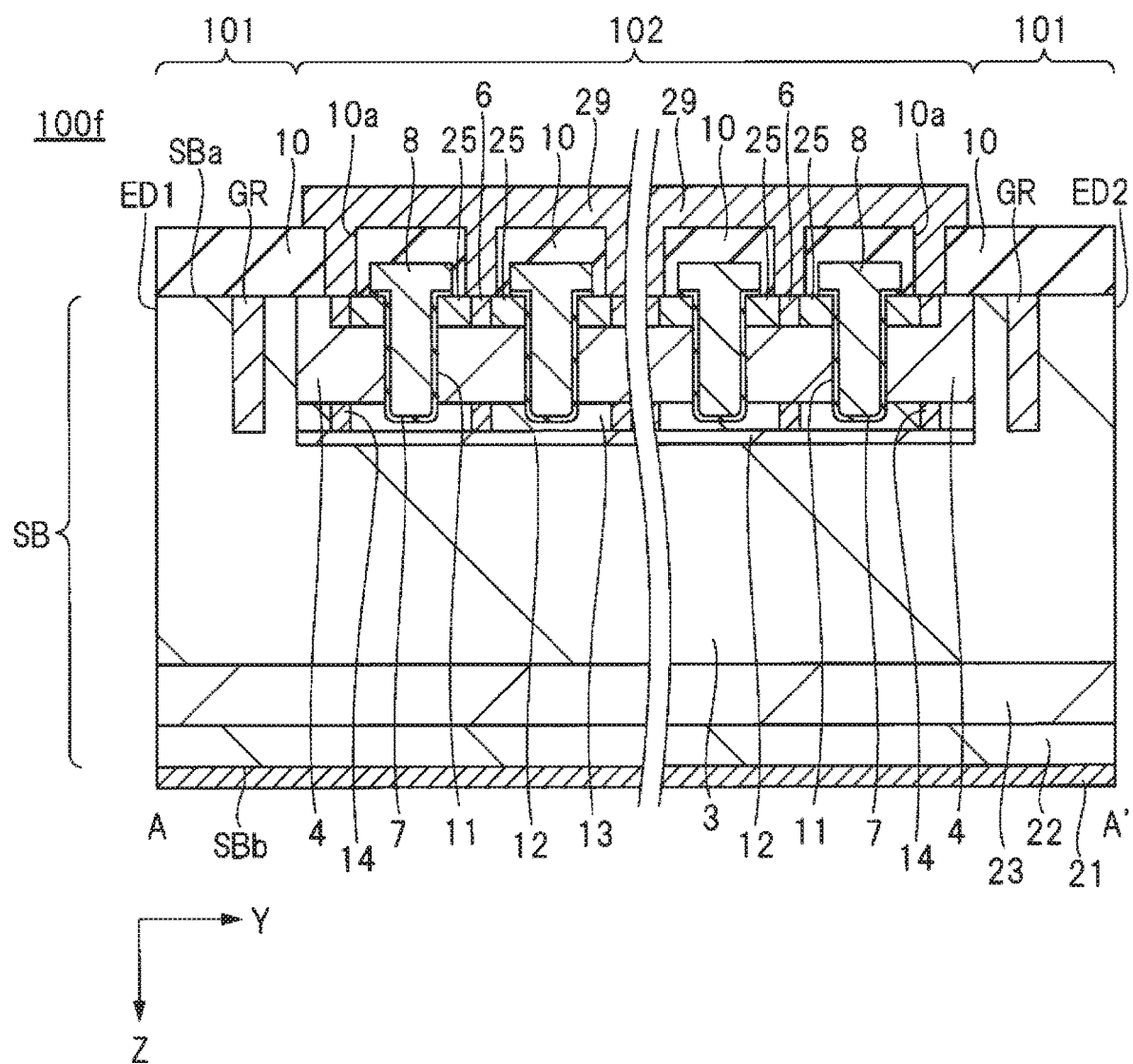
FIG. 25 is a cross-sectional view of a semiconductor device according to Example 7.

A semiconductor device 100$f$ according to Example 7 is modification of Example 6, and a p-type semiconductor region 14 is provided in Example 6. FIG. 25 is a cross-sectional view of the semiconductor device 100$f$ according to Example 7, and the semiconductor device 100$f$ is an IGBT. By the correspondence of Example 5 and the addition of a buffer region 23, Example 7 can be described from the description of Example 3.

Example 8

Figure 26:
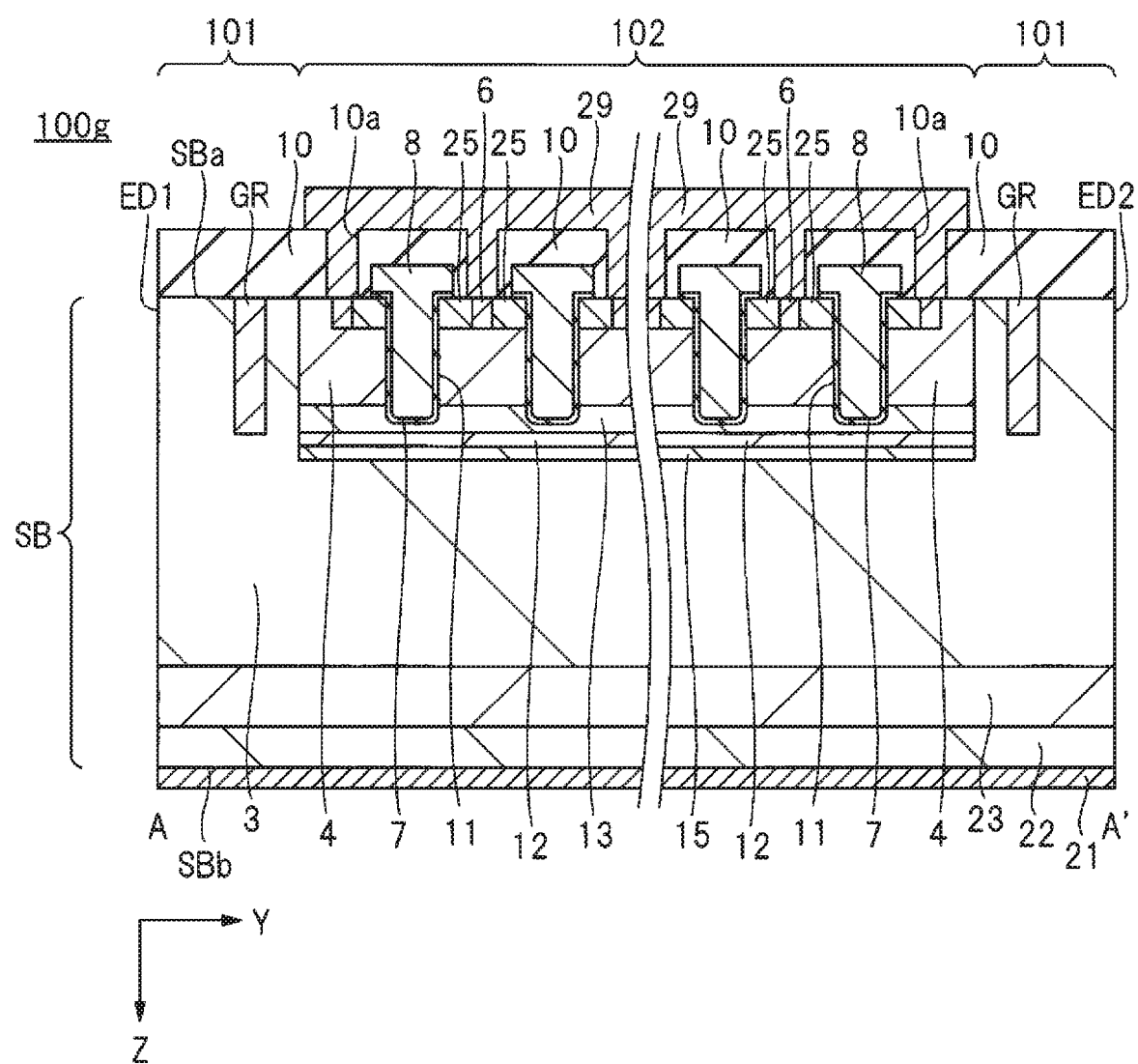
FIG. 26 is a cross-sectional view of a semiconductor device according to Example 8.

A semiconductor device 100$g$ according to Example 8 is modification of Example 6, and an n-type semiconductor region 15 is provided in Example 6. FIG. 26 is a cross-sectional view of the semiconductor device 100$g$ according to Example 8, and the semiconductor device 100$g$ is an IGBT. By the correspondence of Example 5 and the addition of a buffer region 23, Example 8 can be described from the description of Example 4.

The present invention is not limited to the above-described Examples, and various modifications are included in it. For example, the above-described Examples are described in detail for convenience of description and good understanding of the present invention, and thus the present invention is not limited to one having all the described configurations. Additionally, it is possible to replace a part of the configuration of certain Example with the configuration of another Example, and it is also possible to add the configuration of certain Example to the configuration of another Example. Further, regarding a part of the configuration of each Example, addition of another configuration, its deletion, and replacement with another configuration can be performed.

What is claimed is:

1. A semiconductor device comprising:
a semiconductor substrate having a main surface and a back surface;
a drift region provided in the semiconductor substrate so as to be in contact with the main surface, the drift region having a first conductivity type;
a body region selectively provided in the drift region, the body region having a second conductivity type different from the first conductivity type;
first and second grooves passing through the body region, the first and second grooves extending in a first direction in plan view and disposed in a spaced relationship from each other in a second direction perpendicular to the first direction;
a first semiconductor region formed in the body region, the first semiconductor region disposed between the first groove and the second groove and having the second conductivity type;
a second semiconductor region formed in the body region, the second semiconductor region disposed between the first groove and the first semiconductor region and having the first conductivity type;
a third semiconductor region formed in the body region, the third semiconductor region disposed between the second groove and the first semiconductor region and having the first conductivity type;
a fourth semiconductor region formed in the drift region, the fourth semiconductor region disposed below the first and second grooves and having the second conductivity type;
a first gate electrode formed in the first groove with a first gate insulating film interposed therebetween;
a second gate electrode formed in the second groove with a second gate insulating film interposed therebetween;

a first electrode formed on the main surface of the semiconductor substrate, the first electrode electrically connected to the first semiconductor region, the second semiconductor region, and the third semiconductor region; and a second electrode formed on the back surface of the semiconductor substrate, wherein the fourth semiconductor region continuously extends below the first groove and below the second groove in the first direction, and the fourth semiconductor region continuously extends below the first groove, the second semiconductor region, the first semiconductor region, the third semiconductor region, and the second groove in the second direction.

2. The semiconductor device according to claim 1, wherein the fourth semiconductor region continuously extends over the entire body region in plan view.

3. The semiconductor device according to claim 1, wherein the semiconductor substrate is made of a semiconductor material having a band gap wider than that of silicon.

4. The semiconductor device according to claim 1, wherein an impurity concentration of the fourth semiconductor region is lower than an impurity concentration of the body region.

5. The semiconductor device according to claim 1, wherein the semiconductor device includes a transistor formed between the first electrode and the second electrode, and the fourth semiconductor region is completely depleted in its thickness direction during an ON operation of the transistor.

6. The semiconductor device according to claim 1, wherein the fourth semiconductor region is located below the body region so as to be in contact with the body region.

7. The semiconductor device according to claim 1, further comprising a fifth semiconductor region located between the body region and the fourth semiconductor region, the fifth semiconductor region having the first conductivity type.

8. The semiconductor device according to claim 7, further comprising a sixth semiconductor region disposed so as to divide the fifth semiconductor region in the second direction, the sixth semiconductor region connecting the body region and the fourth semiconductor region and having the second conductivity type.

9. The semiconductor device according to claim 7, further comprising a seventh semiconductor region disposed below the fourth semiconductor region in the drift region, the seventh semiconductor region having the first conductivity type, wherein an impurity concentration of the seventh semiconductor region is higher than an impurity concentration of the drift region.

* * * * *